(12) United States Patent
Mi

(10) Patent No.: US 9,356,091 B2
(45) Date of Patent: May 31, 2016

(54) METHOD FOR FABRICATING OPTICAL SEMICONDUCTOR TUBES AND DEVICES THEREOF

(71) Applicant: The Royal Institution for the Advancement of Learning / McGill University, Montreal (CA)

(72) Inventor: Zetian Mi, LaSalle (CA)

(73) Assignee: The Royal Institute for the Advancement of Learning/McGill University, Montreal (CA)

( * ) Notice: Subject to any disclaimer, the term of this patent is extended or adjusted under 35 U.S.C. 154(b) by 173 days.

(21) Appl. No.: 13/627,271

(22) Filed: Sep. 26, 2012

(65) Prior Publication Data

US 2013/0087890 A1      Apr. 11, 2013

Related U.S. Application Data

(62) Division of application No. 12/983,921, filed on Jan. 4, 2011, now Pat. No. 8,313,966.

(60) Provisional application No. 61/291,966, filed on Jan. 4, 2010.

(51) Int. Cl.
| | |
|---|---|
| *H01L 29/06* | (2006.01) |
| *B82Y 10/00* | (2011.01) |
| *B82Y 20/00* | (2011.01) |
| *B82Y 40/00* | (2011.01) |
| *G02B 6/12* | (2006.01) |
| *H01L 29/66* | (2006.01) |
| *H01L 29/775* | (2006.01) |
| *H01S 5/02* | (2006.01) |
| *H01S 5/10* | (2006.01) |
| *H01S 5/34* | (2006.01) |
| *B82Y 99/00* | (2011.01) |

(52) U.S. Cl.
CPC ............... *H01L 29/06* (2013.01); *B82Y 10/00* (2013.01); *B82Y 20/00* (2013.01); *B82Y 40/00* (2013.01); *G02B 6/12* (2013.01); *H01L 29/0665* (2013.01); *H01L 29/0673* (2013.01); *H01L 29/66469* (2013.01); *H01L 29/775* (2013.01); *H01S 5/021* (2013.01); *H01S 5/0215* (2013.01); *H01S 5/0217* (2013.01); *H01S 5/1042* (2013.01); *H01S 5/1071* (2013.01); *B82Y 99/00* (2013.01); *H01S 5/3412* (2013.01)

(58) Field of Classification Search
USPC .................. 257/618, E21.2, E21.532; 977/73
See application file for complete search history.

(56) References Cited

U.S. PATENT DOCUMENTS

2008/0191242 A1*   8/2008   Detlev ........................ 257/190

* cited by examiner

*Primary Examiner* — Hrayr A Sayadian
(74) *Attorney, Agent, or Firm* — The Law Office of Michael E. Kondoudis

(57) ABSTRACT

Semiconductor micro- and nanotubes allow the incorporation of ordered structures such as quantum wells and quantum dots into them providing the potential for ultralow threshold micro- and nanoscale lasers for use in applications such as future ultrahigh-speed photonic systems as well as quantum information processing. According to the invention a means of manufacturing these with high reproducibility, low processing complexity, and at high densities is provided. Also provided is a means of releasing these micro- and nanotubes with low stress and a method of "pick-and-place" allowing micro- and nanotubes to be exploited in devices integrated on substrates that are either incompatible with the manufacturing technique or where the area of substrate required to manufacture them is detrimental to the cost or performance of the circuit.

15 Claims, 21 Drawing Sheets

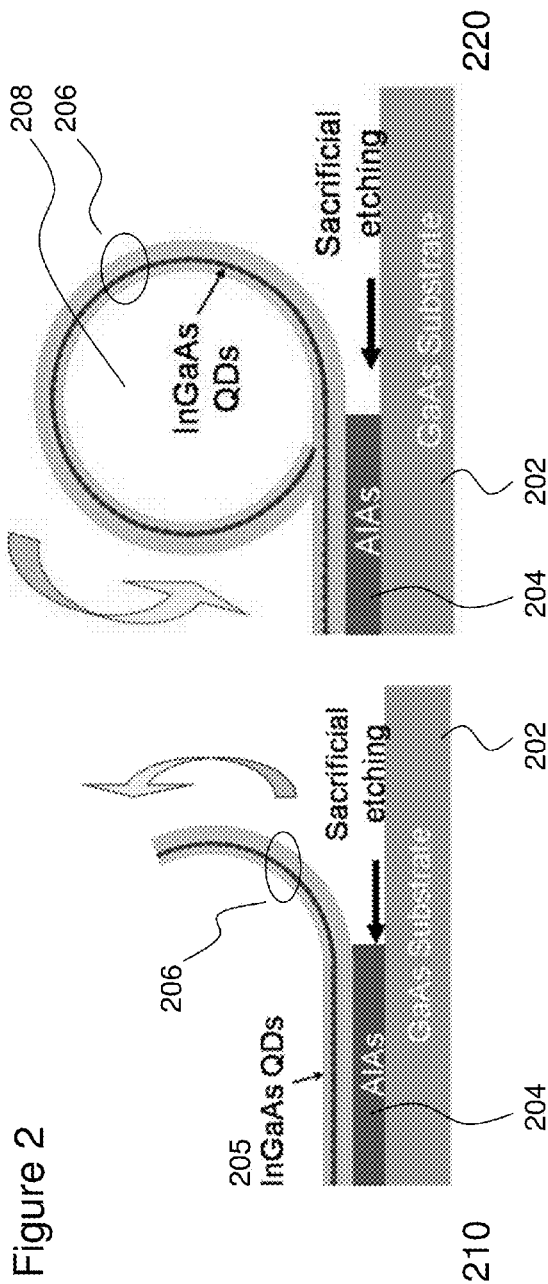
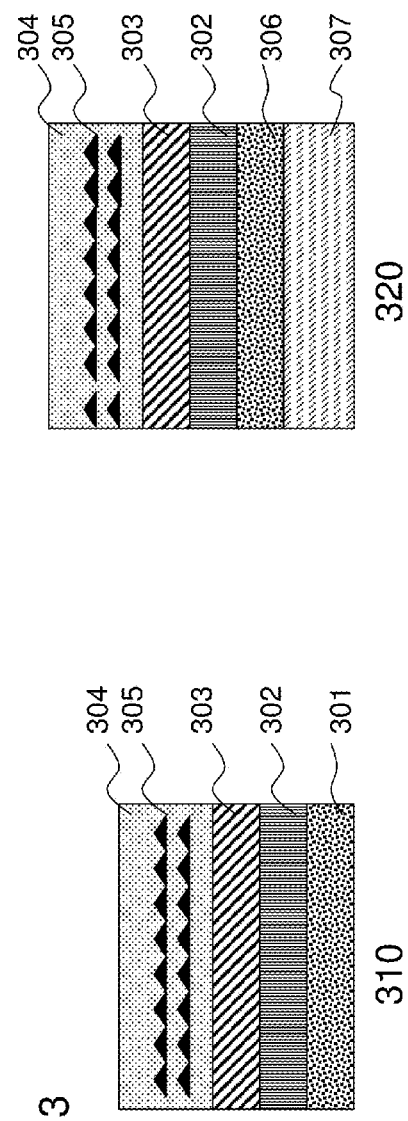
Figure 2
Figure 3

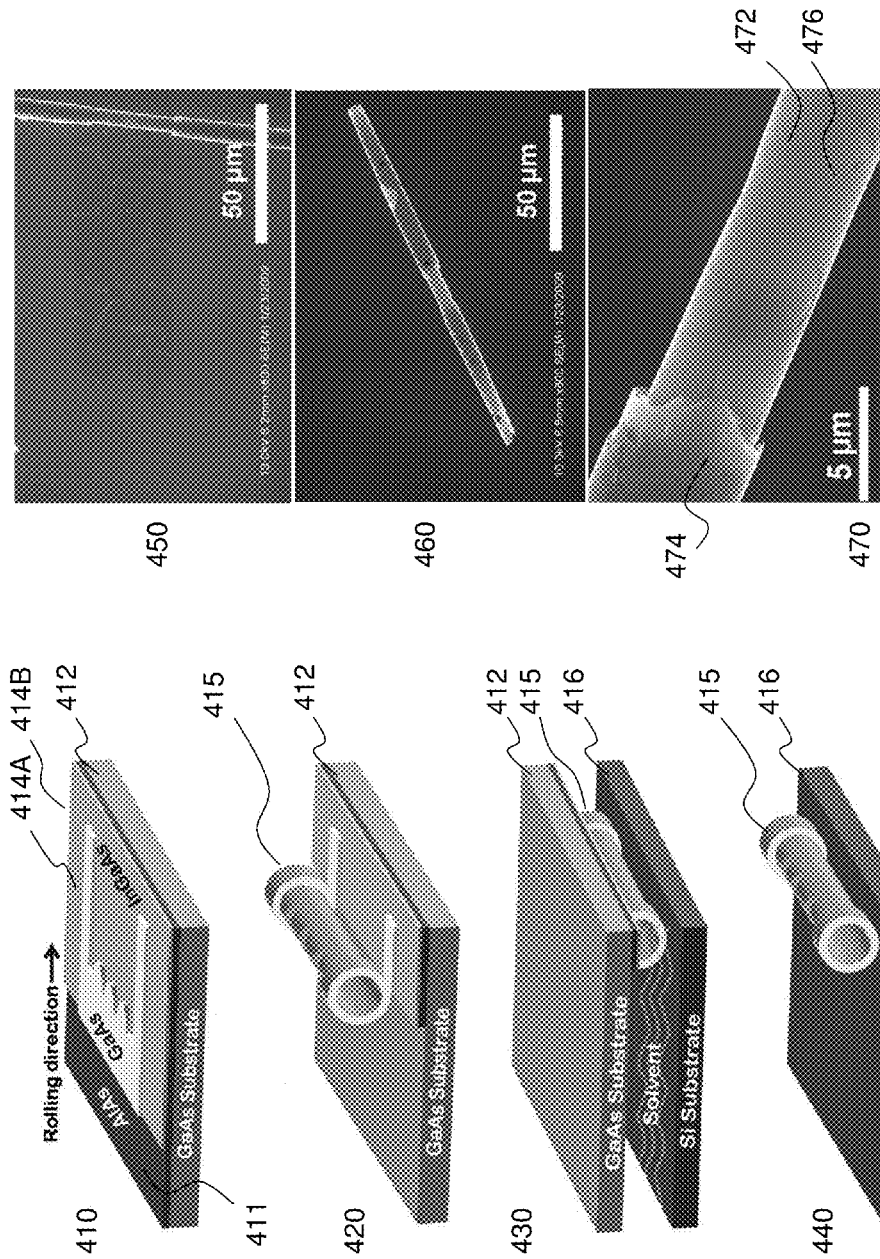

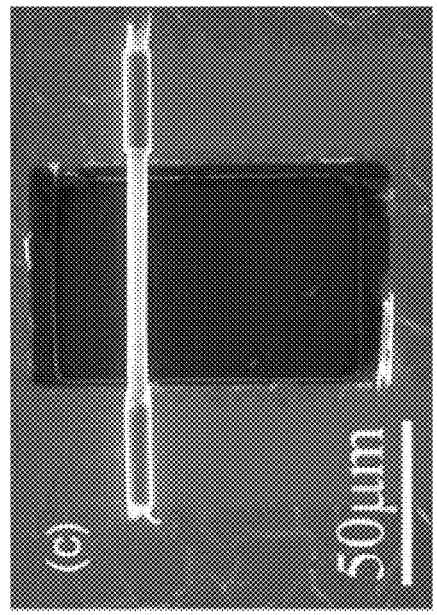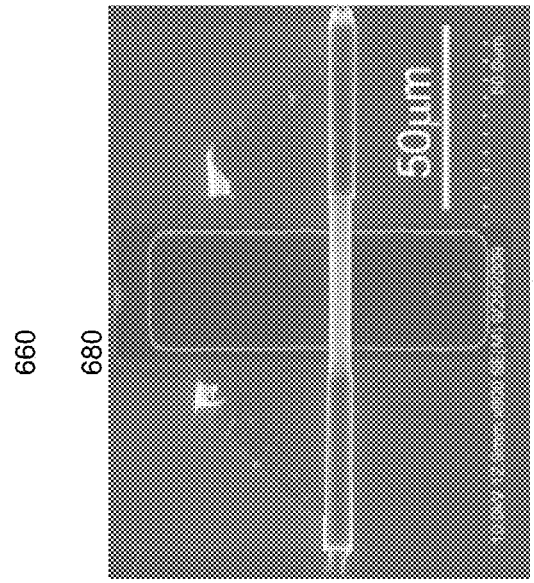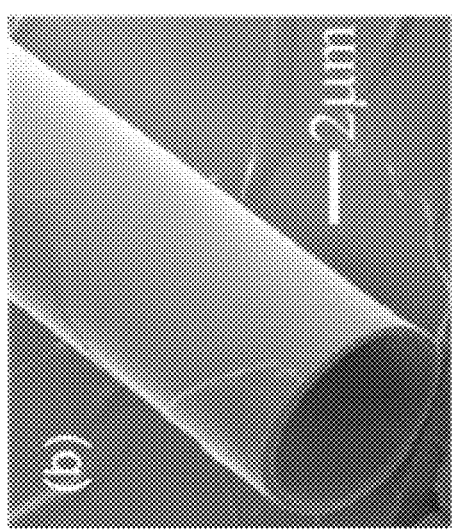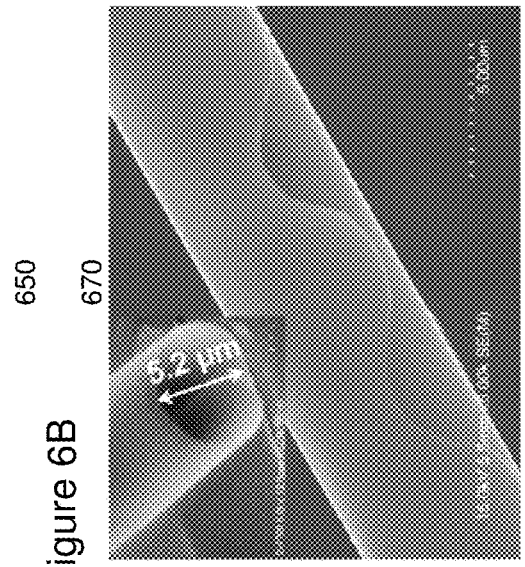
Figure 6B

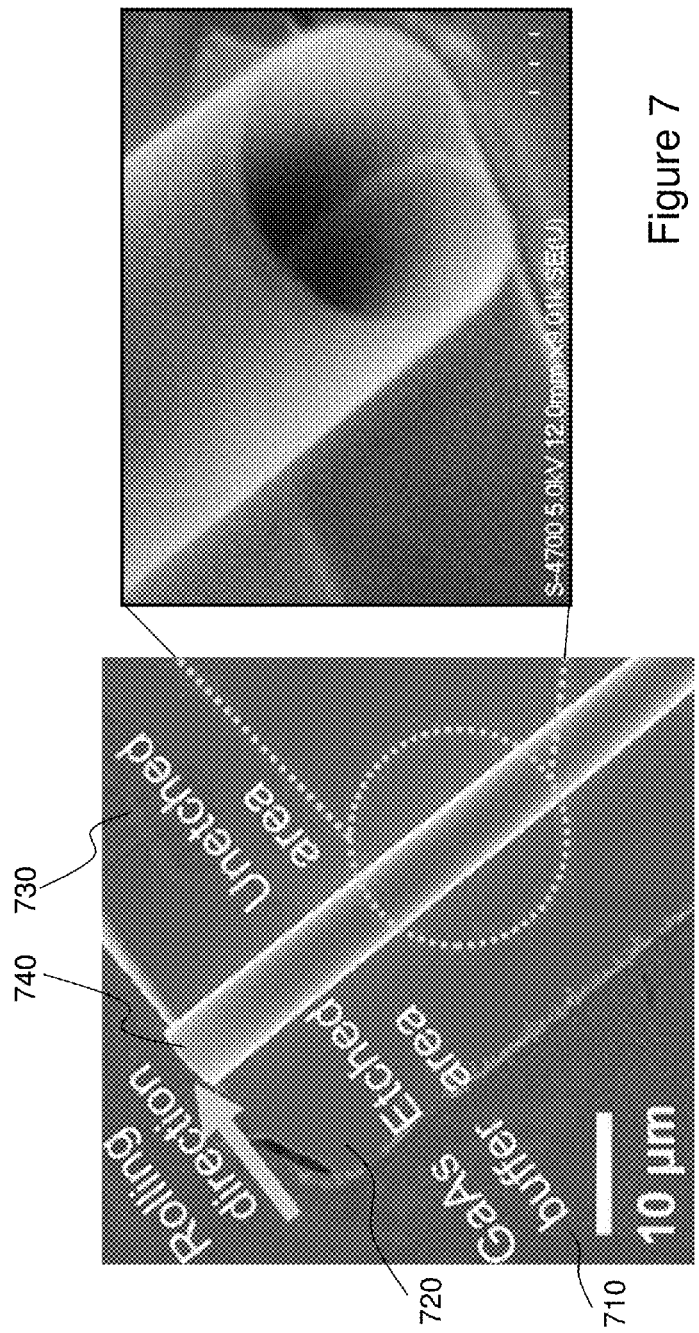
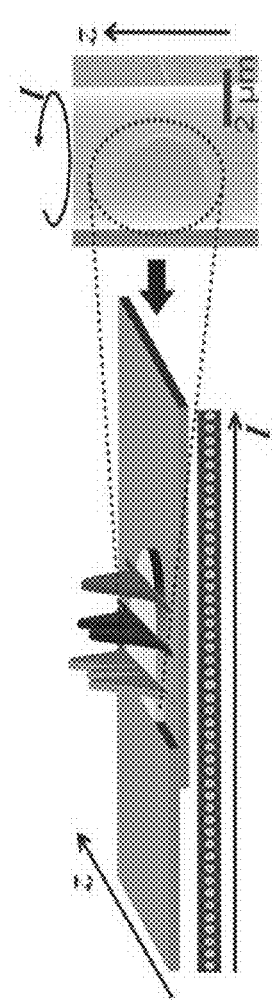
Figure 7
Figure 8A

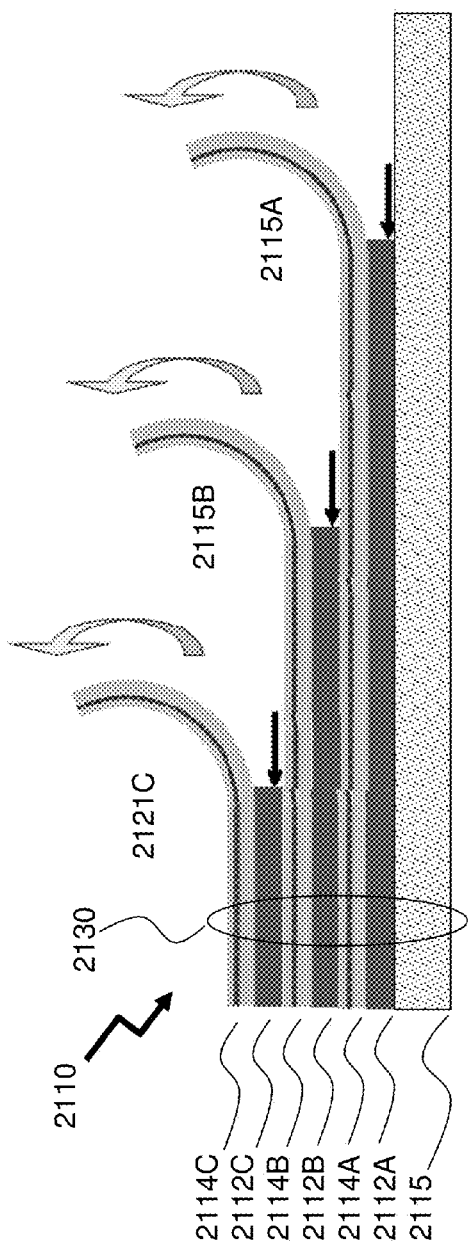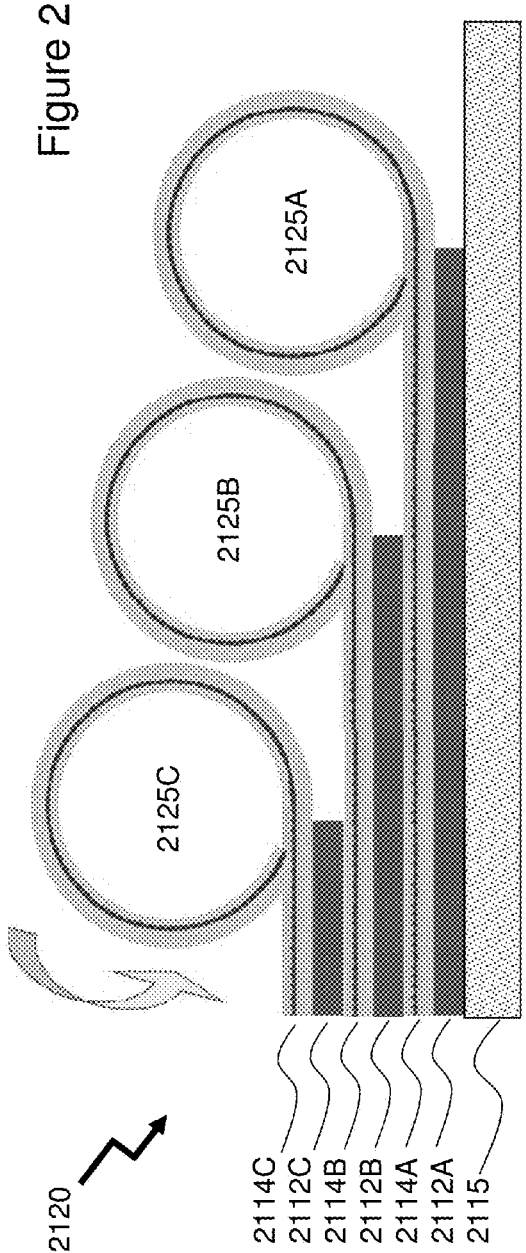
Figure 21

METHOD FOR FABRICATING OPTICAL SEMICONDUCTOR TUBES AND DEVICES THEREOF

CROSS-REFERENCE TO RELATED APPLICATIONS

This patent application claims the benefit of U.S. patent application Ser. No. 12/983,921 entitled "Method for Fabricating Optical Semiconductor Tubes and Devices Thereof", filed Jan. 4, 2011 and U.S. Provisional Patent Application 61/291,966 entitled "Method for Fabricating Optical Semiconductor Tubes and Devices Thereof", filed Jan. 4, 2010.

FIELD OF THE INVENTION

This invention relates to semiconductor optical devices, and more specifically to method of manufacturing micro- and nanotubes and devices incorporating them.

BACKGROUND OF THE INVENTION

The development of ultralow threshold micro- and nanoscale lasers is of critical importance for applications in future ultrahigh-speed photonic systems as well as quantum information processing. In fact, a critical yet missing technology for future chip-level optical communications is a high performance and highly reliable laser on silicon. In this regard, III-V semiconductor lasers on Si as well as the monolithic integration with Si-based waveguide devices have been extensively investigated. However, their practical applications have been limited, to a large extent, by the generation and propagation of dislocations, due to the large lattice and thermal mismatches between III-V materials and Si.

Accordingly, research has focused to reducing the dimensions of the optical devices to both reduce the effects of these large lattice and thermal mismatches with devices of reduced dimensions but to also provide optical devices that do not absorb large areas of silicon circuits. In recent years significant progress has been made in various semiconductor microcavities, such as microdisks, micropillars, and photonic crystals, wherein quantum wells or dots are often incorporated as the gain media. The realization of such devices, however, generally involves the use of fairly complicated top-down fabrication processes and to date has been limited to devices that operate at low temperatures and/or pulsed modes. Recently, rolled-up micro- and nanotube based optical cavities have been intensively investigated, which are formed when coherently strained semiconductor heterostructures are selectively released from the host substrates. Combining the advantages of both top-down and bottom-up fabrication processes, this approach provides a great degree of flexibility in tailoring the optical modes by varying the tube diameters, wall thicknesses, as well as the surface geometry. The resulting micro and nanotube cavities can exhibit epitaxially smooth surface and a near-perfect overlap between the maximum optical field intensity and the gain medium, which are well suited for realizing lasers with low threshold.

Since the first demonstration by Prinz et al., rolled-up semiconductor micro- and nanotubes have been realized utilizing InGaAs/GaAs, SiGe, and $SiO/SiO_2$ based materials and have been investigated for applications in nanophotonic devices and biosensors. Optical resonance modes in rolled-up InAs/GaAs semiconductor tube structures were first demonstrated at very low temperatures of approximately 5 K by Kipp et al and their unique mode profiles were also analyzed. Subsequently, coherent emission from rolled-up InGaAs/GaAs quantum dot semiconductor tubes at 77 K and room temperature has been demonstrated. More recently, room-temperature lasing has been achieved from free-standing InGaAs/GaAs quantum dot semiconductor tube optical ring resonators under optical pumping. With the development of the special transfer techniques, including substrate-on-substrate and fiber taper assisted transfer processes, nearly defect-free rolled-up semiconductor tube devices can be readily achieved on Si or any other foreign substrates, thereby providing a highly promising approach for realizing high performance CMOS compatible nanoscale lasers.

For practical applications, electrically injected micro- and nanoscale lasers are required. Although electrically injected microdisk, microcylinder, and photonic crystal based devices have been extensively investigated, the achievement of high efficiency, highly reliable, and low threshold operation has remained challenging. In this regard, rolled-up micro and nanotubes provide several important advantages. The epitaxially smooth surface can greatly reduce carrier nonradiative recombination associated with the presence of surface states. In addition, the relative large surface area of a rolled-up semiconductor tube ring resonator makes it possible to place the electrical contacts in the vicinity of the laser active region without adversely affecting the optical mode profiles and device performance. To date, electrically injected rolled-up semiconductor tube based devices have not been reported and it would be beneficial therefore to provide a means of manufacturing such devices.

Within these micro- and nanoscale optical devices it has been envisioned that the incorporation of quantum dots in high Q optical microcavities would lead to nanoscale lasers with potentially ultralow or near-zero threshold, temperature invariant operation, and ultrahigh-speed frequency response, providing the basic building blocks for chip-level optical communications and future quantum networking systems. It would therefore be further beneficial for such microcavities to be manufactured with high quality self-organized quantum dot heterostructures with near-discrete density of states providing large and broad gain. Accordingly the provisioning of electrical injected optical semiconductor tubes would benefit from incorporating strained heteroepitaxy growth to provide such self-organized quantum dot arrays that will be required in providing semiconductor tubes that are initially manufactured using planar semiconductor processing and then rolled-up for compatibility with standard semiconductor processing techniques.

It would also be evident that in many applications direct growth of the optical semiconductor tubes would either not be feasible through processing incompatibilities, performance requirements, etc or that the substrate area required for their fabrication that is then not exploited in the final device. As such the controlled transfer and exact positioning of micro- or nanoscale lasers on a processed complementary metal-oxide-semiconductor (CMOS) chip and their subsequent integration with Si bus waveguides and modulators is in demand for next-generation chip-level optical interconnects. In spite of the significant progress made in dry printing, wafer bonding, solution casting, and more recently substrate-on-substrate (SOS) transfer processes, the reliable transfer of a high-quality optical microcavity on a foreign substrate has hitherto not been achieved. These techniques have been limited, to a large extent, by the unique properties of these optical micro- and nanocavities, which generally rely on the use of free-standing nanomembranes. Consequently, the commonly used dry printing and/or stamping techniques may significantly alter the structural and optical properties of the devices. The presence of a large surface tension for conventional photonic crystal, microdisk, and micropillar devices also makes it extremely difficult to detach the cavities from the handling substrate.

Rolled-up semiconductor micro- and nanotubes, formed when a coherently strained semiconductor bilayer is selectively released from the host substrate can be controllably released from the handling substrate with low stress/strain by selectively etching the underlying sacrificial layer completely beneath the micro- or nanotubes. SOS transfer and solution casting could also used to realize such devices on Si or other foreign substrates. However, a controlled transfer and exact positioning of single micro- and nanotube devices has not been possible with these techniques. In this context, it would be beneficial to have a highly accurate and flexible technique for transferring single rolled-up micro- and nanotube devices that have diameters of a few microns, wall thicknesses of a few nanometers and lengths of several hundreds of microns. It would therefore be beneficial for the micro- and nanotubes to be picked up from their handling substrates and transferred, with a precisely controlled position, directly on the facet of a single-mode fiber. Such an approach offering greatly simplified packaging of the optical devices within the context of silicon microelectronics.

It is, therefore, desirable to provide a means of manufacturing micro- and nanotubes with high quality allowing the incorporation of ordered structures such as quantum wells and quantum dots and for the method to allow in some applications for high densities of micro- and nanotubes. It would be further beneficial for the method to provide a means of releasing these micro- and nanotubes with low stress and was compatible with a method of "pick-and-place" allowing micro- and nanotubes to be exploited in devices integrated on substrates that are either incompatible with the manufacturing technique or where the area of substrate required to manufacture them is detrimental to the cost or performance of the circuit. It would also therefore be beneficial to provide a means of "pick-and-place" that is low stress.

SUMMARY OF THE INVENTION

It is an object of the present invention to obviate or mitigate at least one disadvantage of the prior art.

In accordance with an embodiment of the invention there is provided a method comprising providing a host substrate, depositing a sacrificial layer onto said host substrate, and depositing at least one semiconductor layer of a plurality of semiconductor layers on top of the sacrificial layer wherein the plurality of semiconductor layers have a predetermined profile vertically of at least one of stress and strain. The method further comprising patterning a first predetermined portion of the plurality of semiconductor layers to form a mesa and etching the sacrificial layer to selectably release a second predetermined portion of the plurality of semiconductor structures from the substrate.

In accordance with another embodiment of the invention there is provided a device comprising a physical structure, the physical structure formed through a process comprising the steps of providing a host substrate, depositing a sacrificial layer onto said host substrate, and depositing at least one semiconductor layer of a plurality of semiconductor layers on top of the sacrificial layer wherein the plurality of semiconductor layers have a predetermined profile vertically of at least one of stress and strain. The process for forming the physical structure further comprising the steps of patterning a first predetermined portion of the plurality of semiconductor layers to form a mesa, and etching the sacrificial layer to selectably release a second predetermined portion of the plurality of semiconductor structures from the substrate.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 2 depicts a schematic of the method showing the incorporation of quantum dots into the semiconductor tube according to an embodiment of the invention; and FIG. 3 depicts exemplary semiconductor epitaxial structures employed in forming semiconductor tubes according to embodiments of the invention;

FIG. 4A depicts a transfer method for semiconductor tubes that can be employed with semiconductor tubes manufactured according to an embodiment of the invention;

FIG. 4B depicts SEM micrographs of semiconductor tubes manufactured according to embodiments of the invention;

FIG. 6B depicts micrographs of semiconductor tubes manufactured according to embodiments of the invention;

FIG. 7 depicts micrographs of semiconductor tubes manufactured according to embodiments of the invention;

FIG. 8A depicts the origin of the optical mode structure within a semiconductor tube according to embodiments of the invention;

FIG. 21 depicts a schematic for manufacturing semiconductor tubes with high density according to an embodiment of the invention.

DETAILED DESCRIPTION

The present invention is directed to semiconductor optical devices, and more specifically to method of manufacturing micro- and nanotubes and devices incorporating them.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

Within the text below and the embodiments of manufacturing, use, etc contained within the term "semiconductor tube" has been used and refers to either a semiconductor tube or a semiconductor nanotube. Similarly whilst reference is made primarily to GaAs/InAlGaAs semiconductors for embodiments of the invention it would be understood by one skilled in the art that other semiconductor material systems may be employed without departing from the scope of the invention according to the optical wavelength of the devices being provided and the constraints of material processing, suitable sacrificial layers, material properties etc. Such material systems may include binary, tertiary and quaternary semiconductors within the InGaAsSb, InGaAsP, AlGaAsP, CdZnSeTe, and GaAlAsSb material systems as well as silicon, germanium, and selenides of Zn, Mg, and Cd.

Figure 1:
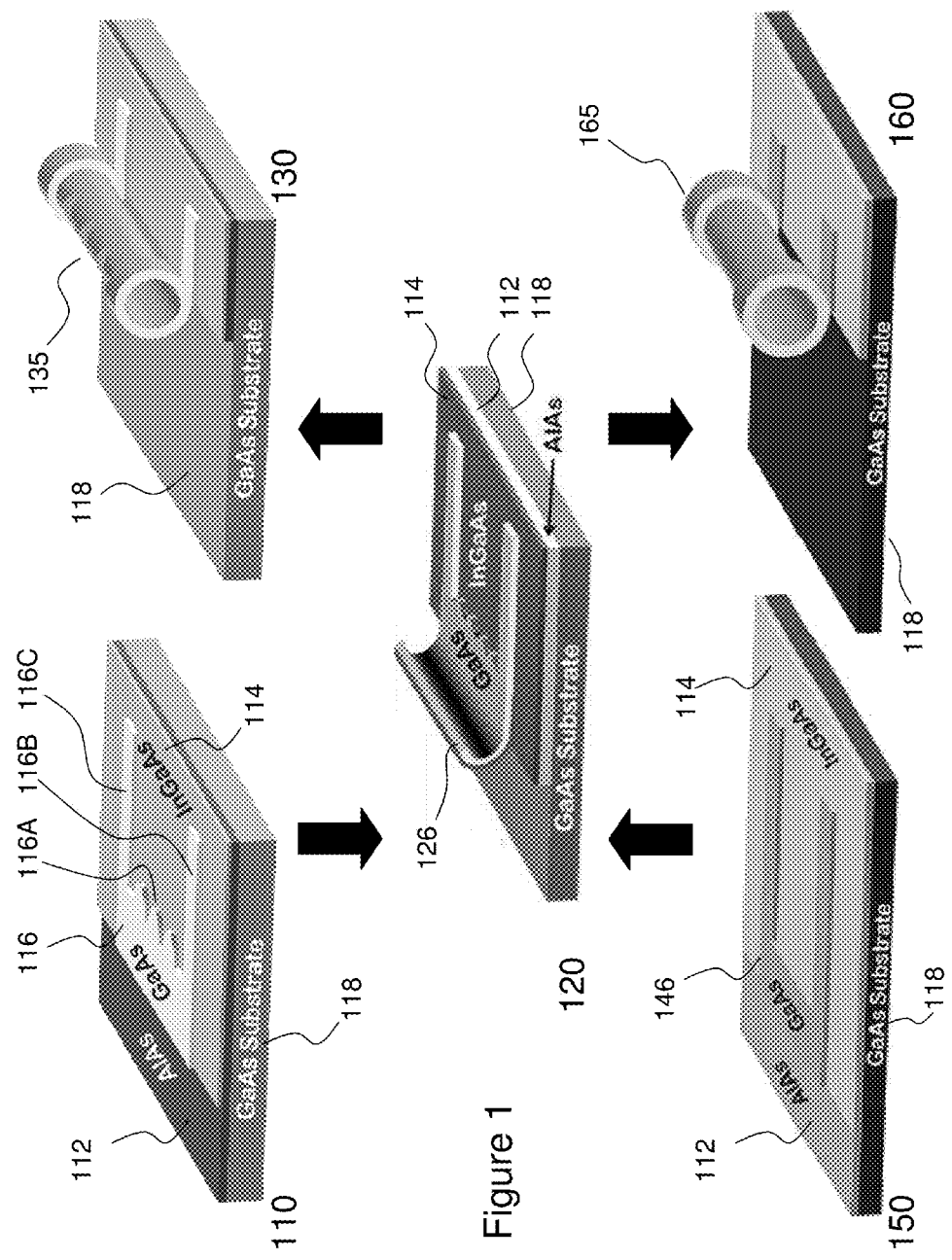
FIG. 1 depicts schematics of manufacturing semiconductor tubes using a semiconductor manufacturing methodology with and without structured edges according to an embodiment of the invention.

FIG. 1 depicts schematics of manufacturing semiconductor tubes using a semiconductor manufacturing methodology with and without structured edges according to an embodiment of the invention. As shown in first deposited layer structure 150 to achieve a free-standing semiconductor tube, a U-shaped mesa is defined within a GaAs layer 146 that sits atop a semiconductor epitaxial structure comprising AlAs 112, InGaAs 114 and GaAs 146 layers which were deposited atop a GaAs substrate 118. A mesa was then defined by etching into the InGaAs 114 layer, and one edge of the mesa the 112 AlAs layer, which will form a sacrificial layer, was also etched through. This edge of the mesa is used to define the starting edge of the rolled-up semiconductor tube. The self-rolling process is initiated with the selective removal of the AlAs 112 sacrificial layer using HF based solutions. As shown in partial etch structure 120 after a certain distance, the middle part of the semiconductor tube separates from the substrate and begins to curl, curled structure 126, through the stress distribution within the now free layer. Further etching in combination with the continuous rolling of the tube on the side pieces results in first free-standing semiconductor tube 165, as depicted in first finished structure 150.

For example the InGaAs/GaAs bilayer heterostructure may be grown as a 50 nm AlAs layer on GaAs substrates by molecular beam epitaxy and comprising a 20 nm In0.18Ga0.82As layer with a 30 nm GaAs layer. Likewise in second deposited layer structure 110 to achieve a free-standing semiconductor tube, a U-shaped mesa is defined within a GaAs layer 116 that sits atop a semiconductor epitaxial structure comprising AlAs 112, InGaAs 114 and GaAs 116 layers which were deposited atop a GaAs substrate 118. A mesa was then defined by etching into the InGaAs 114 layer, and one edge of the mesa the AlAs 112 layer, which will form a sacrificial layer, was also etched through. This edge of the mesa is used to define the starting edge of the rolled-up semiconductor tube. The self-rolling process is initiated with the selective removal of the AlAs 112 sacrificial layer using HF based solutions. As shown in partial etch structure 120 after a certain distance, the middle part of the semiconductor tube separates from the substrate and begins to curl, curled structure 126, through the stress distribution within the now free layer. Further etching in combination with the continuous rolling of the tube on the side pieces results in second free-standing semiconductor tube 135, as depicted in second finished structure 130.

In second deposited layer structure 110 the GaAs 146 layer is patterned with a predetermined profile 116A on the inner region, which is evident on the outer surface of the free-standing semiconductor tube 135. As will be evident below from discussions on the structure of the optical modes within such semiconductor tubes the predetermined profile 116A can be tailored to adjust the resulting optical mode profile of the semiconductor tube providing a mechanism of tailoring such optical mode profile through the photolithography step defining the etched pattern of the GaAs 146 layer.

Within another embodiment of the invention, not shown in FIG. 1, a reduction in the radiative loss of the optical modes through the substrate, the region between the two side pieces 116B and 116C of the U-shaped mesa is etched through the InGaAs 114, AlAs 112 and into the GaAs substrate 118. This etching for example being approximately 1 μm and increases the air gap between the central part of the semiconductor tube and the substrate. Typically semiconductor tubes fabricated with this method have 1 or 2 revolutions corresponding to wall thicknesses of approximately 50 nm and 100 nm for the epitaxial structure defined supra. Typical; semiconductor tube diameters are approximately 5 μm to 6 μm and are predetermined by the strain of the pseudomorphic InGaAs 114 layer and the subsequently GaAs 116 layer with or without the quantum dot hetero structure.

Referring to FIG. 2 there is depicted a schematic of the method showing the incorporation of quantum dots into the semiconductor tube according to an embodiment of the invention. Accordingly in curl schematic 210 a quantum dot semiconductor structure is shown during the etching step. Accordingly there is a similar structure to that described supra in respect of FIG. 1 comprising an InGaAs/GaAs bilayer heterostructure 206 comprising a 50 nm AlAs layer 204 on GaAs substrates by molecular beam epitaxy and comprising a 20 nm In0.18Ga0.82As layer with a 30 nm GaAs layer. Embedded within the GaAs matrix of the InGaAs/GaAs bilayer heterostructure 206 are one or two layers of In0.5Ga0.5As quantum dot layers 205. Selective etching of the AlAs 204 layer causes the InGaAs/GaAs bilayer heterostructure 206 to being rolling-up into the semiconductor tube, due to the relaxation of strain. The tube diameter is determined by the bilayer thicknesses and compositions, and the number of rotations is controlled by the etching time. Tube schematic 220 showing a single rotation of the InGaAs/GaAs bilayer heterostructure 206 thereby forming a cavity 208 within the resulting semiconductor tube.

Now referring to FIG. 3 exemplary semiconductor epitaxial structures employed in forming semiconductor tubes according to embodiments of the invention are depicted. As shown first epitaxial structure 310 represents a structure such as described supra in respect of FIGS. 1 and 2. According there is shown an InGaAs/GaAs bilayer heterostructure grown on a 50 nm AlAs 302 layer on n+GaAs substrate 301, for example by molecular beam epitaxy. The heterostructure consists of a 20 nm In0.18Ga0.82As 303 layer and a 30 nm GaAs layer 304 as well as two vertically coupled In0.5Ga0.5As QD layers 305 embedded in the GaAs matrix. Accordingly first epitaxial structure 310 allows semiconductor tubes to be fabricated on GaAs substrates for either direct integration into microwave, RF or electronic circuits formed on GaAs or their removal and transfer to another substrate. Second semiconductor structure 320 provides a variant of the structure that is compatible with forming InGaAs/GaAs semiconductor tubes on silicon wafers. Accordingly there is shown the same InGaAs/GaAs bilayer heterostructure grown on a 50 nm AlAs 302 layer where the heterostructure consists of a 20 nm In0.18Ga0.82As 303 layer and a 30 nm GaAs layer 304 as well as two vertically coupled In0.5Ga0.5As QD layers 305 embedded in the GaAs matrix. However, now the AlAs 302 layer is grown atop a GaAs layer 306 that has been grown on a silicon 307 substrate. In this manner the structures can be integrated with silicon electronics, including for example CMOS.

Now referring to FIG. 4A depicts a transfer method for semiconductor tubes that can be employed with semiconductor tubes manufactured according to an embodiment of the invention. Pseudomorphic InGaAs/GaAs quantum dot heterostructures were grown on GaAs substrates, which consist of a 50 nm AlAs sacrificial layer 411 and 20 nm In0.18Ga0.82As 414B and 30 nm GaAs layers 414A. Two In0.5Ga0.5As quantum dot layers were embedded in the GaAs matrix, not shown for clarity. The use of quantum dots can substantially reduce nonradiative recombination associated with the presence of surface defects, due to the three dimensional localization of carriers in the dots. As shown in pre-etch schematic 410 a strained U-shaped mesa was first defined by etching the GaAs 414A to the InGaAs layer 414B. The AlAs sacrificial layer 411 was also etched through at the starting edge of the rolled-up semiconductor tube. The self-rolling process was initiated with the selective etching of the AlAs sacrificial layer 411 using hydrofluoric acid based solutions due to the relaxation of strain in the InGaAs/GaAs bilayer. After a certain distance, the middle part of the tube is separated from the substrate and as a result, continuous rolling on the side pieces leads to freestanding semiconductor tubes 415 on GaAs substrate 412 as illustrated in pre-release schematic 420. It may be noted that the presence of a sinusoid corrugation at the inner edge of the mesa results in semiconductor tube ring resonators with an engineered geometry as will be discussed below.

To achieve semiconductor tube ring resonators employing semiconductor tubes 415 on Si substrate 416, the thin AlAs sacrificial layer underlying the mesa is completely etched and the fully released quantum dot semiconductor tubes 415 are then registered on the GaAs substrate 413. Subsequently, as shown in transfer schematic 430 the GaAs substrate 413 is placed directly on top of the Si substrate 416 with the presence of an appropriate solvent. When the GaAs substrate 413 is removed, freestanding semiconductor tubes 415 preferentially stay on the Si substrate 416 due to the gravitational force induced by the solvent in and around the tube. Upon drying out the solvent the semiconductor tubes 415 are attached to the Si wafer 416 by van der Waals bonding as shown in final schematic 440.

Referring to FIG. 4B there are depicted SEM micrographs of semiconductor tubes manufactured according to embodiments of the invention such as described above in respect of FIGS. 1 through 4A. The scanning electron microscopy SEM image of an InGaAs/GaAs quantum dot semiconductor tube fabricated on a GaAs substrate is shown in first SEM 450, which is evidenced by the presence of an etched GaAs mesa upon the formation of the semiconductor tube. Second SEM 460 shows a quantum dot semiconductor tube transferred on a clean Si substrate that is free of any etched pattern. The sinusoidal geometry of the freestanding region of a quantum dot semiconductor tube on Si can also be clearly identified, as illustrated in third SEM 480 where rolled end 464 is shown along with the body 472 of the central region of the semiconductor tube and the sinusoidal edge of the GaAs is shown by line 476. Such quantum dot semiconductor tube exhibit a diameter of approximately 5.2 µm and in this example the freestanding region 472 was formed by 2.5 revolutions, thereby yielding wall thicknesses of approximately 100 µm and 150 µm for the regions with 2 and 3 revolutions respectively. The air gap between the semiconductor tube and Si substrate, determined by the etching time, is estimated to be approximately 0.3 µm. The substrate-on-substrate transfer technique allows for the achievement of semiconductor tube ring resonators on Si with extremely smooth surface and excellent structural properties that is not possible using either of the dry-printing or solution-casting based processes of the prior art. For 2.5 rotations the etching process removed approximately of 21 µm of AlAs such that where the semiconductor tube is formed and employed on the same substrate without any transfer an region of approximately 25 µm would be devoid of device elements to provide the region for the deposition of the epitaxial structure that would be subsequently rolled up during the etching step.

Figure 5A:
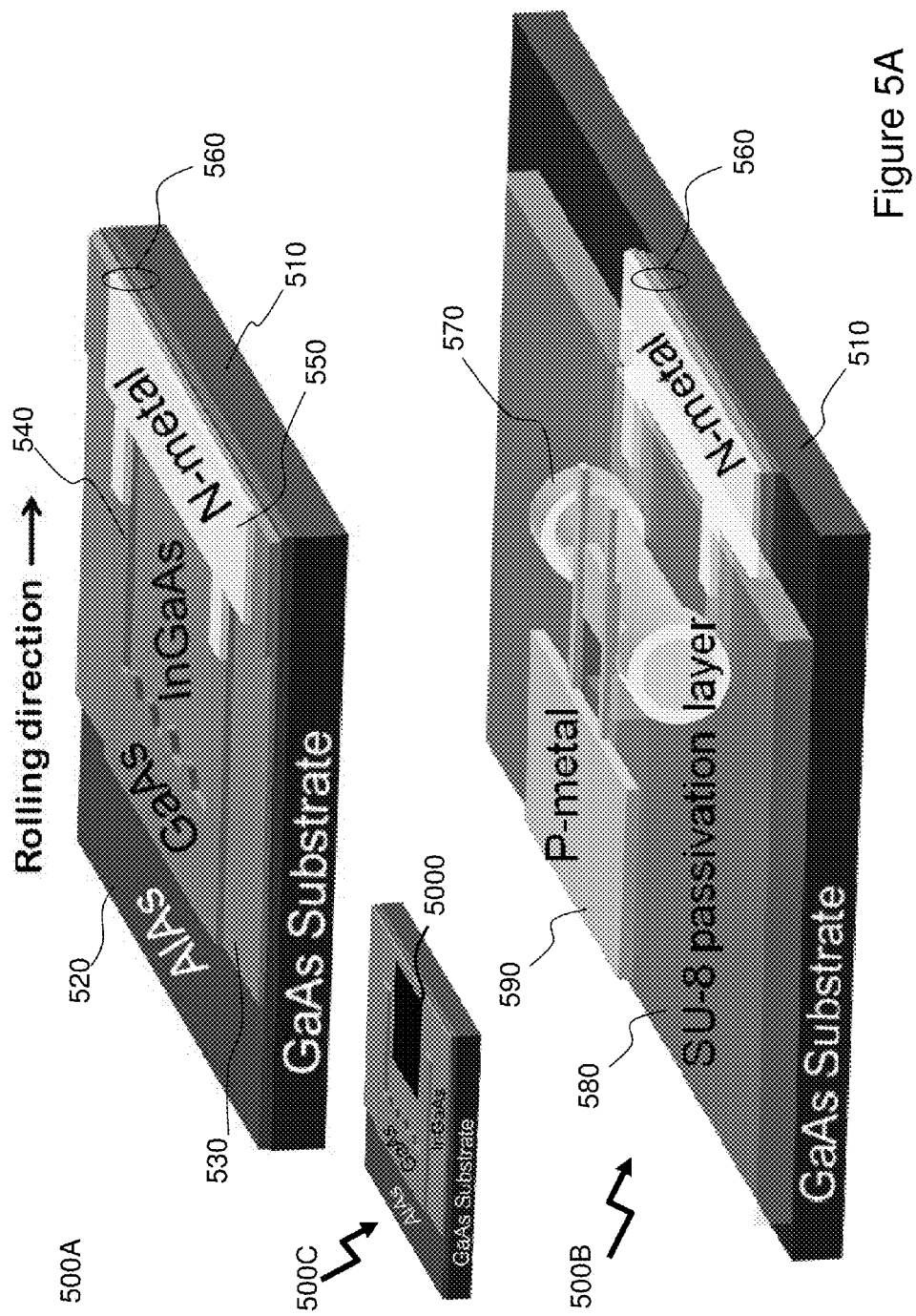
FIG. 5A depicts a method of manufacturing a semiconductor tube as part of an electrical circuit for electrical injection of carriers in semiconductor optical sources according to an embodiment of the invention.

Now referring to FIG. 5A there is depicted a method of manufacturing a GaAs/InAlAs semiconductor tube within a GaAs electrical circuit for electrical injection of carriers to provide a semiconductor optical source according to an embodiment of the invention. The electrically injected device heterostructure, shown in pre-etching schematic 500A is very similar to the InGaAs/GaAs bilayer heterostructure described above in respect of FIGS. 1 through 4B except that the top GaAs 540 and the strained InGaAs 530 layers are doped with Si and Be respectively. Self-organized InGaAs quantum dot layers are incorporated in the GaAs 540 layer as the gain media, but are not shown for clarity. The epitaxial structure further including the AlAs 520 sacrificial layer between the InGaAs 530 and the substrate 510 and an N-metal contact formed in N-metal 550. During the fabrication process, a U-shaped mesa was first defined using standard photolithography and wet etching techniques, followed by the deposition of the N-metal 550 layer on the end of the mesa and the two side-pieces of the mesa.

The free-standing rolled-up semiconductor tube structure 570 was then fabricated by etching the AlAs 520 layer. Subsequently, SU-8 580, an epoxy based negative photoresist providing a passivation and planarization layer with a thickness of approximately 4 µm to 5 µm, was spin coated onto the wafer. Next a P-metal contact was formed in P-metal 590 that was deposited in regions of the free-standing rolled-up semiconductor tube structure 570 where the SU-8 580 is selectively removed, as illustrated interconnected tube schematic 500B. Referring to perspective view 500C there is shown an alternative embodiment of the structure prior to etching wherein the region between the two sidepieces of the U-shaped mesa was etched to approximately 1 μm deep, with the sidewalls protected by a thin (approximately 0.1 μm) SiNx layer. The trench 5000 providing increased separation of the fabricated semiconductor tube from the substrate.

Figure 5B:
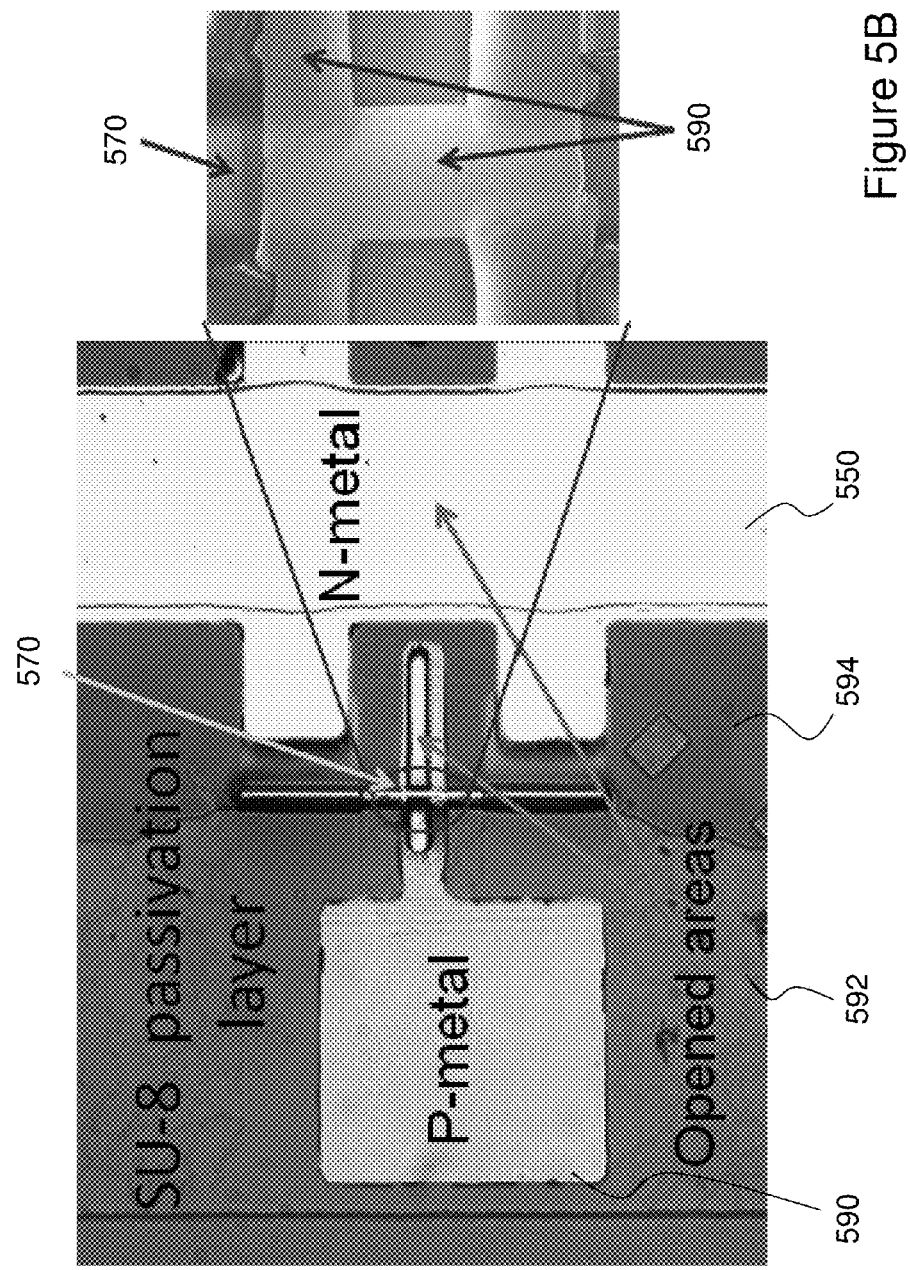
FIG. 5B depicts a semiconductor tube and electrical interconnects manufactured according to the method of FIG. 5A.

Now referring to FIG. 5B there is depicted an optical micrograph of a semiconductor tube and electrical interconnects manufactured according to the method of FIG. 5A. The optical micrograph of the electrically injected rolled-up semiconductor tube device clearly depicts the free-standing semiconductor tube 570, P-metal 590 contact, and the N-metal 550 contact. An SEM image of the P-metal contact and the free-standing semiconductor tube region is shown in the inset to the right. Accordingly in this design, electrons and holes are injected directly from the supporting side-pieces and the top surface of the free-standing semiconductor tube respectively. The radiative recombination of charge carriers in the quantum dot active region leads to the emission of photons, which can be largely confined in the micro-tube ring resonator formed by the semiconductor tube 570.

Figure 6A:
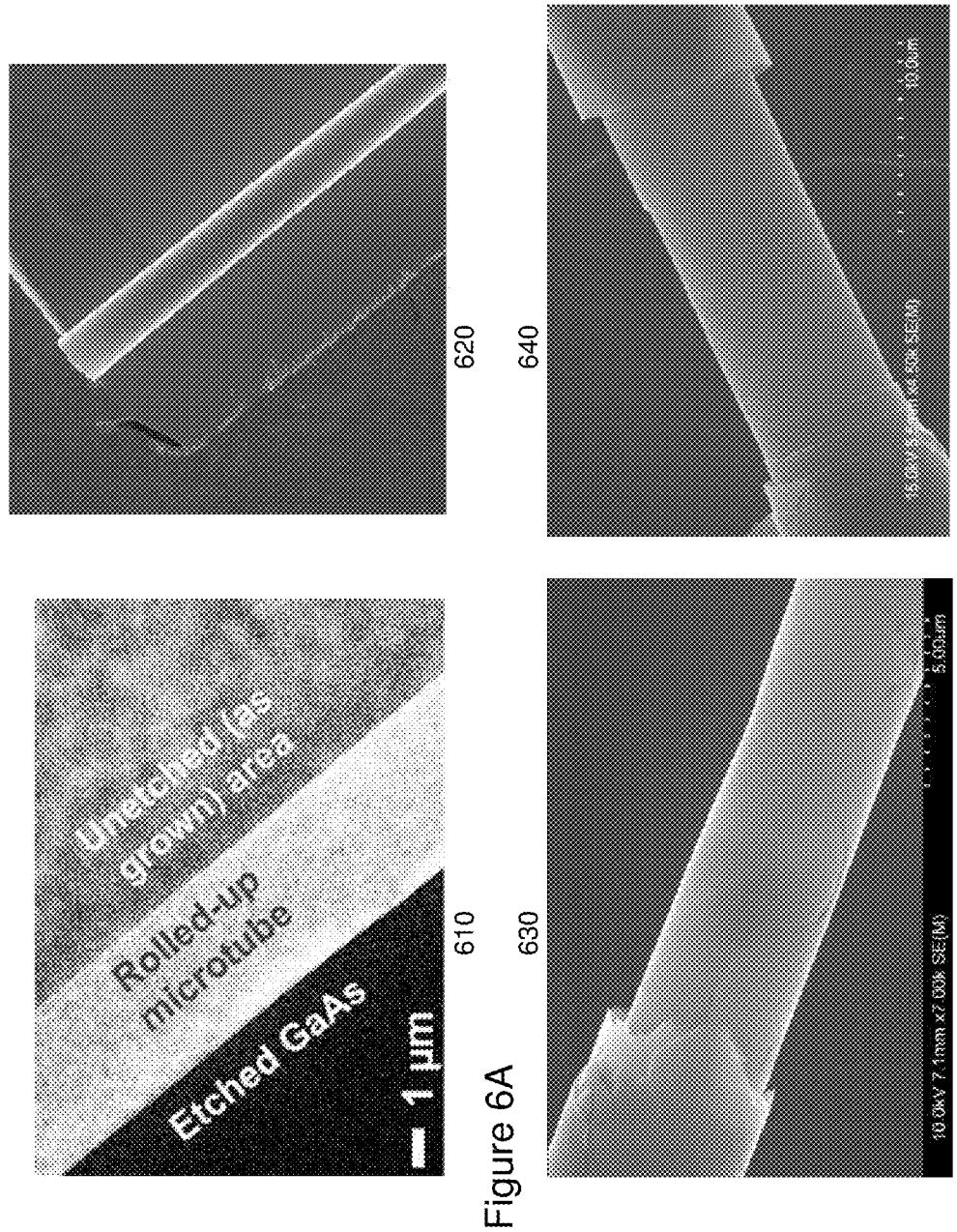
FIG. 6A depicts micrographs of semiconductor tubes manufactured according to embodiments of the invention.

Referring to FIG. 6A there are depicted micrographs of semiconductor tubes manufactured according to embodiments of the invention. First image 610 being a scanning electron microscopy (SEM) image of a single-walled InGaAs QD semiconductor tube with approximately 1.2 turns wherein the etched GaAs, rolled-up semiconductor tube (semiconductor tube), and unetched region are easily identified. Cathodoluminescence monochromatic analysis of the structures has shown that the InGaAs/GaAs quantum dot (QD) semiconductor tube is highly uniform and bright compared with the as-grown QD layer, suggesting a significant improvement of the QD optical quality. Second image 620 shows a scanning electron microscopy image of a semiconductor tube wherein the etched GaAs, formed semiconductor tube, and unetched region are easily identified. Third image 630 shows in detail a semiconductor tube transferred according to the process described above in respect of FIG. 4A showing that the excellent structural properties of the semiconductor tube are maintained. Fourth image 640 shows an InGaAs/GaAs quantum dot semiconductor tube onto Si substrate. Each of third and fourth images showing the engineered edge profile of the mesa prior to rolling-up that the inventors have identified as allowing precisely tailored optical modes to be achieved.

Now referring to FIG. 6B there are micrographs of semiconductor tubes manufactured according to embodiments of the invention. In fifth image 650 the controlled surface geometry of the semiconductor tube is evident where the surface geometry is directly related to the corrugations introduced at the inner edge of the U-shaped mesa. As described supra reduction in radiative losses through the substrate can be achieved when the region between the two side pieces of the U-shaped mesa is etched to approximately 1 μm before the tube formation, thereby increasing the air gap between the central part of the tube and the substrate. This is shown in sixth image where the deeper trench is evident as the central dark region against the lighter surrounding substrate and semiconductor tube. Seventh image 670 shows a semiconductor tube transferred onto a Si substrate using the newly developed substrate-on-substrate transfer technique described in respect of FIG. 4A showing the InGaAs/GaAs QD semiconductor tube after transfer without degradation of the semiconductor tube or the sinusoidal corrugation resulting from the inner edge of the U-shaped mesa being formed with an engineered geometry. The measured tube diameter, shown in the inset of seventh image 670 is approximately 5.2 μm. Finally in eighth image 680 an SEM image of a free-standing InGaAs/GaAs quantum dot semiconductor tube semiconductor tube is shown wherein the center part of the semiconductor tube is directly over an etched region of the target substrate to reduce any radiative loss through the substrate. It is also evident in this image that the rolled-up structure has broken so that the edges have layers of decreasing width wherein the material not lifted from the substrate is shown as remaining triangular region.

Referring to FIG. 7 there is depicted an SEM micrograph of a semiconductor tube manufactured according to an embodiment of the invention wherein the etched GaAs buffer layer 710, partially rolled-up semiconductor tube 740, etched region 720 where the AlAs sacrificial layer has been etched away and unetched region 730 where the AlAs sacrificial layer has yet to be etched away where in the InGaAs/GaAs bilayer is still planar. As shown in the enlarged SEM the end of the semiconductor tube is shown with an inner diameter of approximately 5.2 μm which is in excellent agreement with the calculated values using continuum mechanical models as will be evident in the results presented below.

Within the preceding descriptions of manufacturing semiconductor tubes according to embodiments of the invention the semiconductor tube comprises an InGaAs/GaAs bilayer heterostructure with quantum dots formed in one or two In0.5Ga0.5As QD layers. The inventors have demonstrated self-organized quantum dots in strained-layer epitaxy of III-V semiconductors, wherein the coherently strained and nearly defect-free quantum dots are formed in the Stranski-Krastanow growth mode. Both molecular beam epitaxy (MBE) and metal organic chemical vapor deposition (MOCVD) have been utilized for the fabrication of self-organized quantum dot heterostructures. In the Stranski-Krastanow growth mode, the transition from a layer-by-layer growth to the formation of three-dimensional islands is governed by the interplay between the interface energy and strain energy. The critical layer thickness, corresponding to the onset of island formation, being largely determined by the lattice mismatch. Above the critical layer thickness, elastic strain relaxation occurs via the formation of coherently strained, defect-free islands. Examples of self-organized QD structures on GaAs and Si layers see Z. Mi et al in "III-V Compound Semiconductor Nanostructures on Silicon: Epitaxial Growth, Properties, and Applications in Light Emitting Diodes and Lasers" (J. Nanophotonics, Vol. 3, 031602, 2009), P. Bhattacharya et al in "Quantum Dot Lasers: From Promise to High-Performance Devices" (J. Cryst. Growth, 311, pp 1625-1631, 2009), and Z. Mi et al in "High Performance Quantum Dot Lasers and Integrated Optoelectronics on Si" (Proc. IEEE, Vol. 97, No. 7, pp 1239-1249).

Figure 8B:
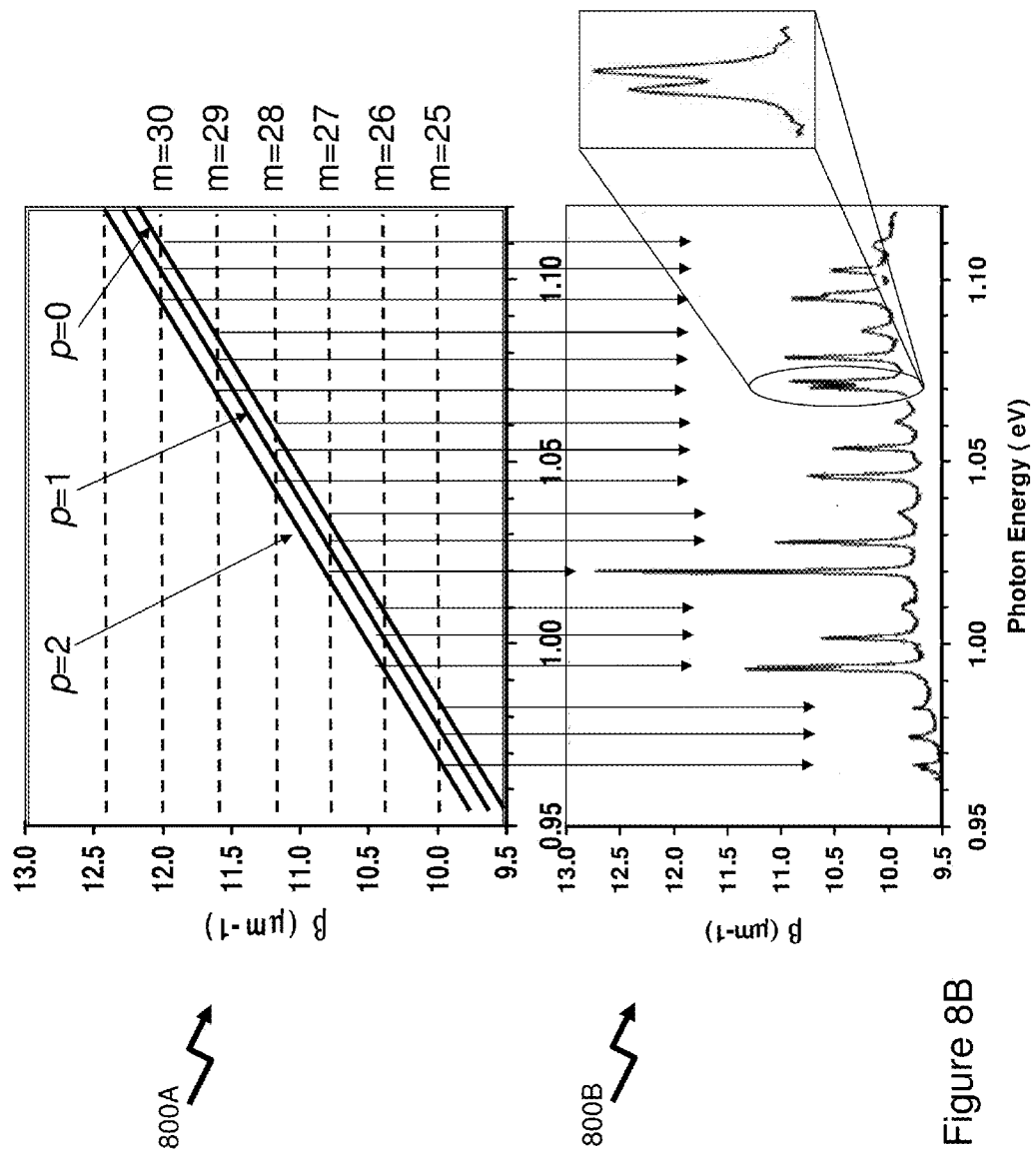
FIG. 8B depicts the origin of the optical mode structure and together with a measured optical spectrum for a semiconductor tube according to an embodiment of the invention.

Now referring to FIGS. 8A and 8B there is depicted the origin of the optical mode structure within a semiconductor tube fabricated according to an embodiment of the invention. The unique emission characteristics of a semiconductor tube with quantum dots can be analyzed, if as an approximation, in the simplest case, the semiconductor tube ring structure is considered as a planar dielectric waveguide with periodic boundary conditions. Illustrated in FIG. 8A is an SEM image of a semiconductor tube as well as the equivalent waveguide model, wherein the outside edge (or the surface corrugation) of the semiconductor tube corresponds to the tapered region of the waveguide. z and l directions, shown in the waveguide model in FIG. 8A, correspond to the tube axial direction and the direction around the tube circumference, respectively. Using this model, effective refractive index, neff(z), for photons propagating along the l direction, averaged over the length of the waveguide (or the circumference of the semiconductor tube). As a result, neff(z) is directly related to the size and shape of the tapered region.

Since the confined optical modes in a single walled semiconductor tube ring resonator is linearly polarized, with the electric field parallel to the tube wall (the z axis), then it is possible to derive the eigenmode distributions of the equivalent two-dimensional waveguide. from the scalar Helmholtz Equation (1) below.

$$-\frac{1}{n_{eff}(z)^2}\left[\frac{\delta^2 E(l,z)}{\delta z^2}+\frac{\delta^2 E(l,z)}{\delta l^2}\right]=k^2 E(l,z) \quad (1)$$

where E(l,z) is the electrical field distribution and k is the vacuum wave vector. Utilizing $E(l, z)=\phi(z)e^{1\beta l}$, where z is the transverse field distribution along the z direction and β is the propagation constant along the l direction, we can obtain Equation (2) for the transverse optical modes from Equation 1.

$$-\frac{d^2\phi(z)}{dz^2}-n_{eff}(z)^2 k^2\phi(z)=-\beta^2\phi(z) \quad (2)$$

For any given wavelength, discrete eigenvalues of Equation (2), i.e., p=0, 1, 2, 3, . . . , can be calculated, which correspond to various transverse modes supported by the waveguide. Therefore, dispersion properties of the equivalent planar dielectric waveguide can be obtained by solving Equation (2) over a wide wavelength range. Dispersion curves (p versus photon energy) for the first three transverse modes (p=0, 1, and 2) are shown in the upper graph 800A of FIG. 8B (solid lines). In this calculation, the tapered region is approximated as a parabolic shape. The cavity eigenmodes are subsequently determined from the intersections between these dispersion curves and the curves describing the azimuthal resonances (dashed lines), i.e. β=2π×m/L, where L is the circumference of the semiconductor tube and m is the azimuthal mode number. Shown in FIG. 8B, it can be seen that the calculated results are in excellent agreement with the measured values which are shown in the measured spectrum 800B in FIG. 8B.

Figure 9:
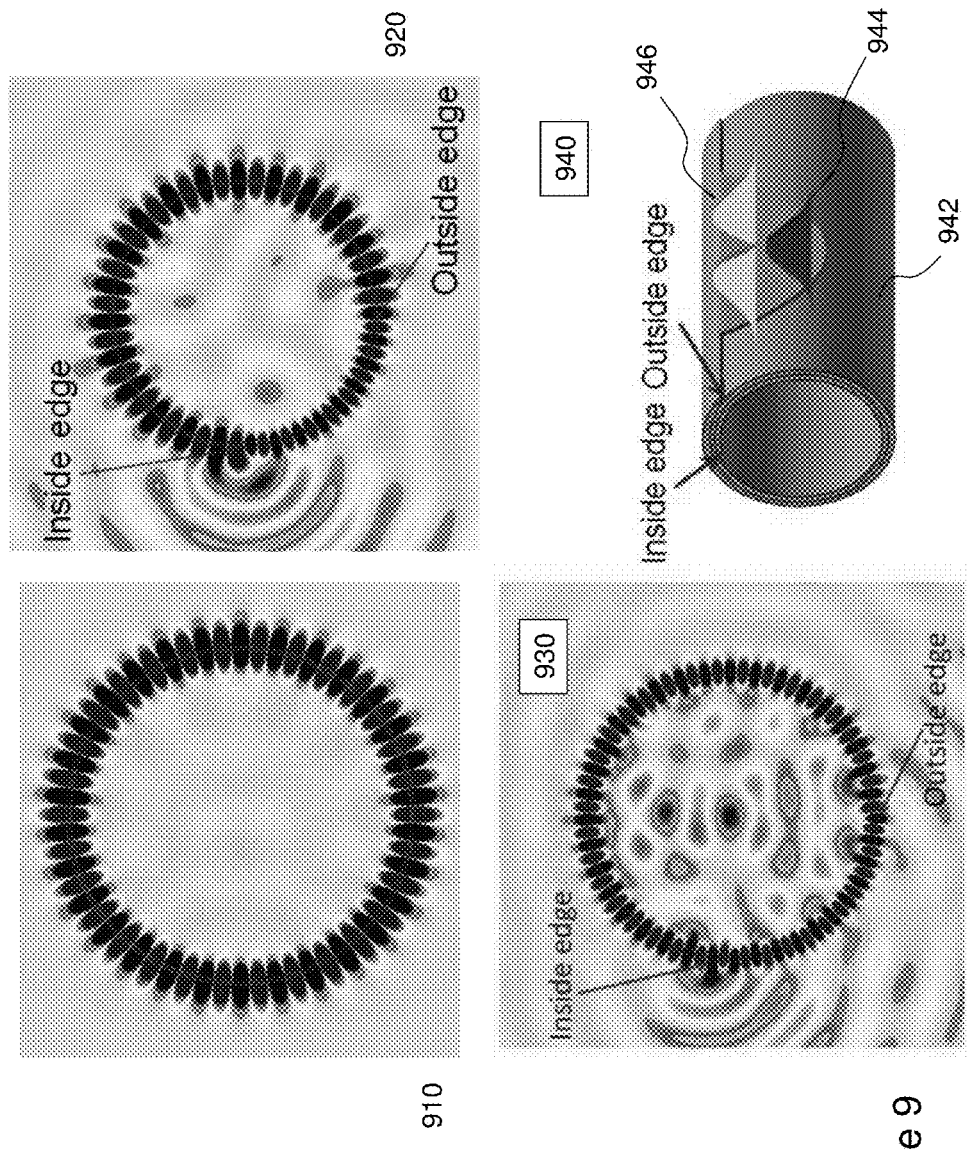
FIG. 9 depicts simulation results for semiconductor tubes according to embodiments of the invention.

Now referring to FIG. 9 there are shown simulation results for semiconductor tubes according to embodiments of the invention. First simulation 910 and second simulation 920 show optical resonance mode profiles, calculated by the finite-difference time domain method, for both an ideal ring resonator (first simulation 910) and a rolled-up semiconductor tube device (second simulation 920) with the same diameter (approximately 5 μm) and wall thickness (approximately 50 nm). It is seen that, while photons are well confined in an ideal ring resonator, strong light scattering occurs at the inside and outside edges of a rolled-up semiconductor tube device. The light scattering effect and, consequently, the Q-factors of the optical cavities, depend strongly on the number of revolutions of the semiconductor tube. Q-factors between approximately 6,000 and approximately 40,000 have been calculated for rolled-up semiconductor tube ring resonators with 1 and 4 revolutions, corresponding to wall thicknesses of approximately 50 nm and 200 nm respectively. Evidently, rolled-up semiconductor tube devices offer the distinct advantages of directional emission as well as controlled output coupling efficiency, which are often difficult to realize in conventional micro- and nanoscale semiconductor optical cavities.

Also shown in FIG. 9 are third simulation 930 and model 940. The confined optical mode, from finite-difference time domain method, shown as azimuthal mode profile for photons (m=37) confined in a rolled-up tube with a diameter of approximately 5.6 μm and wall thickness of 100 nm is shown in third simulation 930. It is seen that coherent emission from rolled-up semiconductor tube is predominantly determined by the photon scattering occurred at the inside edge. The calculated Q-factor is >14,000, which is primarily limited by the optical scattering at the inside and outside edges and, in practice, any irregularities on the surface of the tube as well. This unique phenomenon is enormously important for achieving micro- and nanoscale lasers with controlled emission direction and output efficiency that are generally difficult to realize using photonic crystal, microdisk, and toroidal based optical cavities. The optical resonance modes in rolled-up semiconductor tube are also strongly influenced by the presence of surface corrugations. The first two axial field distributions associated with each azimuthal optical mode confined in the rolled-up semiconductor tube are schematically shown in model 940, which explains the observed higher order modes near the dominant azimuthal modes in the emission spectra presented in FIGS. 11 to 16 below. As shown within the semiconductor tube 944 are first longitudinal mode 942 and second longitudinal mode 946. It is also evident that control of the lasing modes can possibly be achieved in rolled-up micro- and nanotube lasers by varying the semiconductor tube surface geometry. The mode competition amongst various azimuthal modes may not be significant, since these modes are separated by approximately 20 meV, which is larger than the homogeneous linewidth of a single dot (approximately 10-15 meV) at room temperature. However, strong mode competition for the various axial modes associated with the same azimuthal mode number is expected to occur, due to their small (approximately 2-6 meV) separation in energy.

Figure 10:
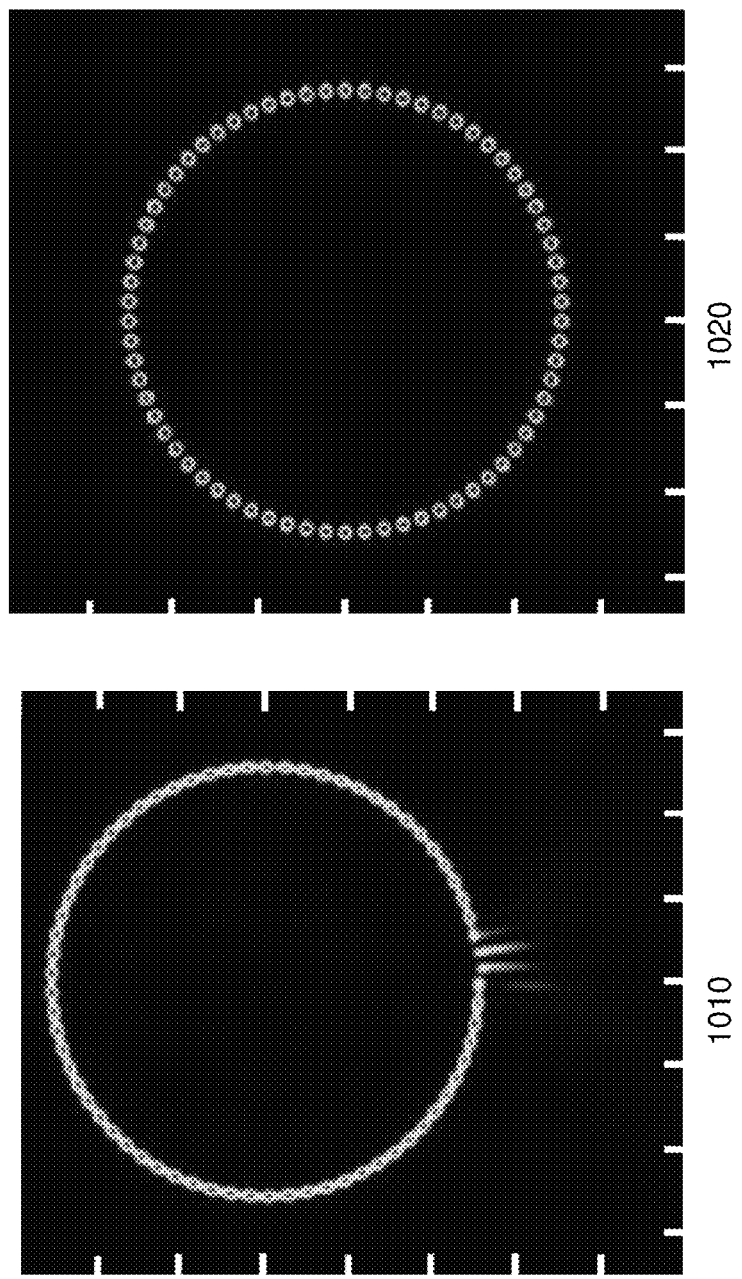
FIG. 10 depicts simulation results for semiconductor tubes according to embodiments of the invention.

Referring to FIG. 10 depicts simulation results for semiconductor tubes according to embodiments of the invention for a rolled-up semiconductor tube with a small wall thickness (approximately 75 nm), again by finite-difference time-domain methods. It was found that TM modes, with an electric field parallel to the tube wall, can be established as optical resonance modes. The calculated TM mode profiles with and without the presence of a GaAs substrate are shown in first and second simulations 1010 and 1020 respectively. Radiative losses through the substrate, evident in first simulation 1010, are identified to be the primary cause for the observed small Q factor of semiconductor tubes with small air gaps to the substrate. It is further calculated that significantly improved Q factors, >5000, can be readily achieved in freestanding QD semiconductor tube resonators. Although an ideal cylindrical resonator consists of a regular sequence of resonance modes, the observed single optical mode of a semiconductor tube is explained by the spiral asymmetry and other imperfections in the semiconductor tube formation. As shown in second simulation 1020 wherein the GaAs substrate separation from the semiconductor tube has been increased, e.g. by etching this region of the substrate prior to rolling-up the semiconductor tube, see perspective view 500C and trench 5000.

Figure 11:
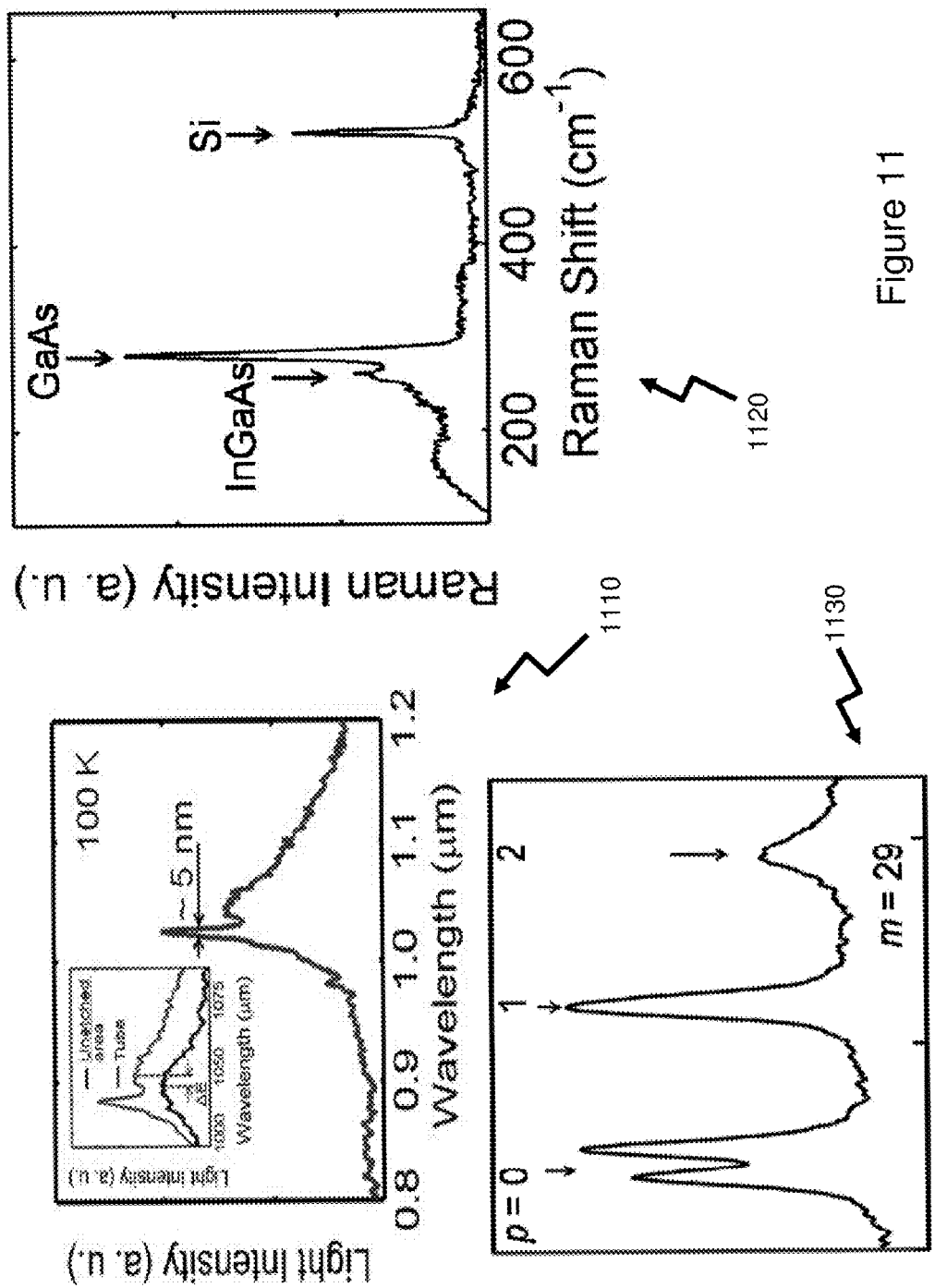
FIG. 11 depicts optical emission spectra for semiconductor tubes according to embodiments of the invention.

Now referring to FIG. 11 depicts optical emission spectra for semiconductor tubes according to embodiments of the invention. First emission spectrum 1110 depicts cathodoluminescence (CL) measurements for an InGaAs/GaAs QD semiconductor tube ring resonator taken directly from the QD semiconductor tube resonator at 100 K and is also compared with that of the as-grown QD layer (inset of first emission spectrum 1110). An optical resonance mode at approximately 1020 nm can be observed, proving, for the first time, that a rolled-up semiconductor tube, with an average wall thickness of approximately 75 nm, can serve as an optical ring resonator. The emission linewidth is approximately 5 nm, corresponding to a cavity Q factor of 204. It may also be noted that, with the reduced strain distribution in the semiconductor tubes, there is a small red shift (approximately 10 meV) in the QD signal. Second emission spectrum 1120 depicts for a rolled-up quantum dot semiconductor tubes with an engineered surface geometry where a Raman spectrum for these semiconductor tubes is shown, wherein peaks associated with the InGaAs and GaAs layers, and the Si substrate can be clearly identified Third emission spectrum 1130 depicts the emission of a freestanding quantum dot semiconductor tube with the presence of corrugations at an excitation power of approximately 30 μW at room temperature is shown. This detailed view of the eigenmodes associated with azimuthal mode number m=29 is shown with the axial mode numbers (p) identified. The two non-degenerate modes associated with p=0 are induced by the inside and outer side edges around the tube. Additionally, associated with each azimuthal mode m is a group of optical resonance modes with different axial field distributions, which are directly related to light localization along the tube axis due to the presence of corrugations. Evidently, by varying the tube geometry, an exact tailoring of the 3-dimensionally confined optical modes can be achieved. A minimum intrinsic linewidth of approximately 0.4 nm is derived for these structures, corresponding to a Q-factor of ~3,000. It is important to note that such a relatively high Q-factor is achieved in a single wall semiconductor structure, with a wall thickness of merely 50 nm.

Figure 12:
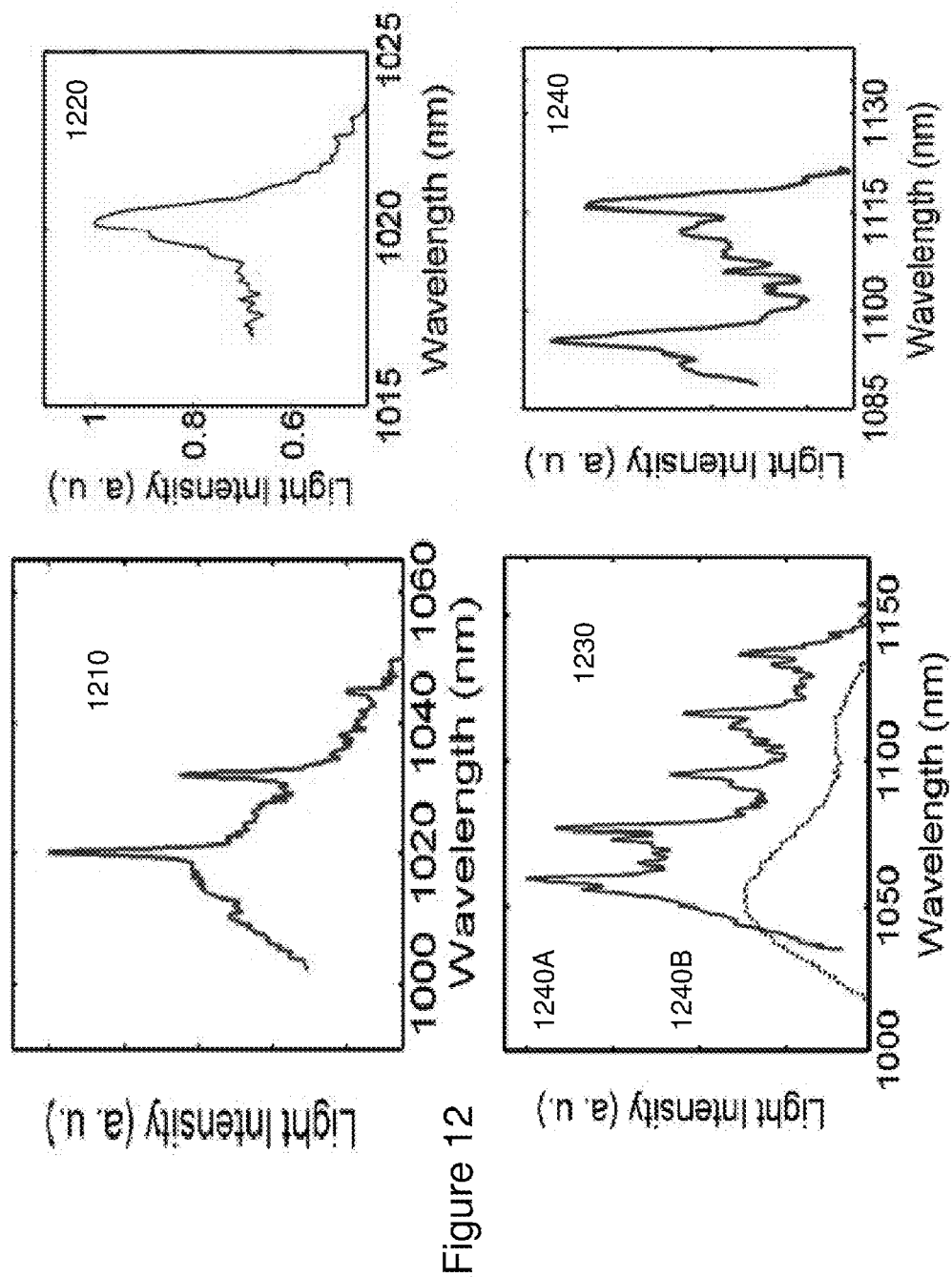
FIG. 12 depicts optical emission spectra for semiconductor tubes according to embodiments of the invention.

Now referring to FIG. 12 there are shown first to fourth optical emission spectra 1210 through 1240 respectively are shown. Considering initially first and second optical emission spectra 1210 and 1220 respectively the emission characteristics of a free-standing InGaAs/GaAs quantum dot semiconductor tube optical ring resonator on GaAs was studied using micro-photoluminescence measurements. In these measurements the semiconductor tube with InGaAs/GaAs bilayer heterostructure with approximately 2.5 revolutions, therefore with wall thicknesses varying from approximately 100 nm to approximately 150 nm. The sample was mounted on a cryostat with continuous liquid nitrogen flow and cooled to 77 K. A semiconductor laser, with an emission wavelength of 641 nm was focused onto the free-standing region of the semiconductor tube using an objective (100×, NA=0.7). The emitted light was collected by the same objective, analyzed by a spectrometer, and detected by a liquid nitrogen cooled InGaAs detector and lock-in amplifier. In this measurement scheme, both the excitation and signal collection are located at the same spot. The emission characteristic measured at a pump power of 22 μW is shown in first optical emission spectrum 1010 showing sharp optical resonant modes, spaced apart by approximately 14 meV. It should also be noted that the presence of the inside and outside edges leads to non-degenerate optical modes, illustrated in second optical emission spectrum 1220. An intrinsic Q factor of approximately 3,000 was derived for the structure. Analysis using finite-difference time domain methods determined that the observed optical modes are TM polarized, with an electric field parallel to the semiconductor tube wall.

In third and fourth optical emission spectra 1230 and 1240 respectively the emission characteristic of 3-dimensionally confined InGaAs/GaAs quantum dot semiconductor optical ring resonators transferred onto Si substrates are presented. The measurement scheme was identical to that described above in respect of first and second optical emission spectra 1210 and 1220 respectively. The photoluminescence spectrum measured from the free-standing quantum dot semiconductor tube is shown in third optical emission spectrum 1230, which exhibits five dominant optical eigenmodes, curve 1240A. Photoluminescence emission directly from the as grown quantum dot ensemble is also shown for comparison with second curve 1240B. Referring to fourth optical emission spectrum 1140 which is an expansion of a region of third optical emission spectrum 1130 between 1090 nm and 1120 nm axial optical modes can also be observed which are related to the engineered shape of the semiconductor tube optical ring resonator. These measurements being taken with a pump power of 15 μW at 77 K. Both the axial and radial modes are therefore illustrated in the fourth optical emission spectrum 1240.

Figure 13:
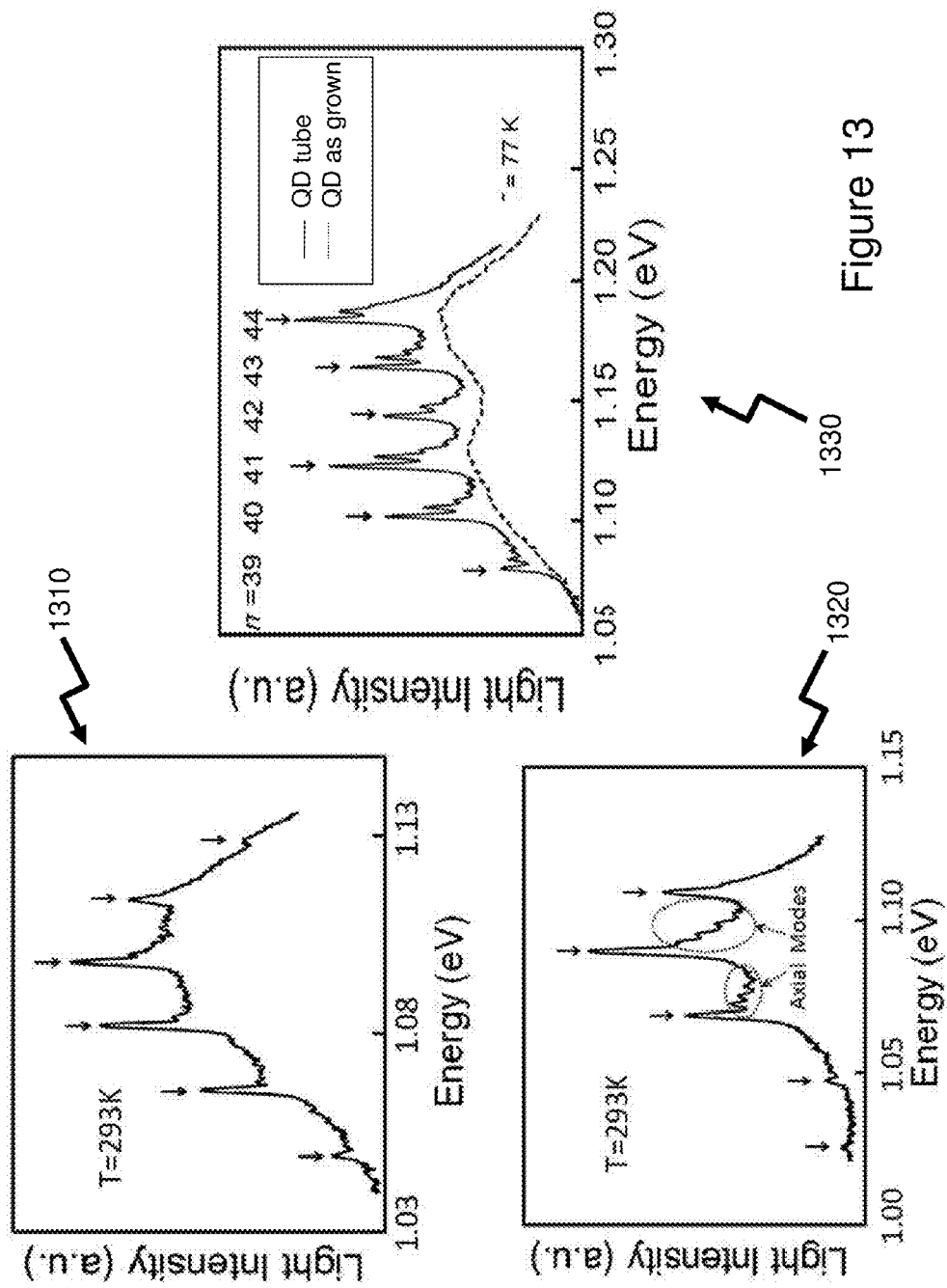
FIG. 13 depicts optical emission spectra for semiconductor tubes according to embodiments of the invention.
Figure 14:
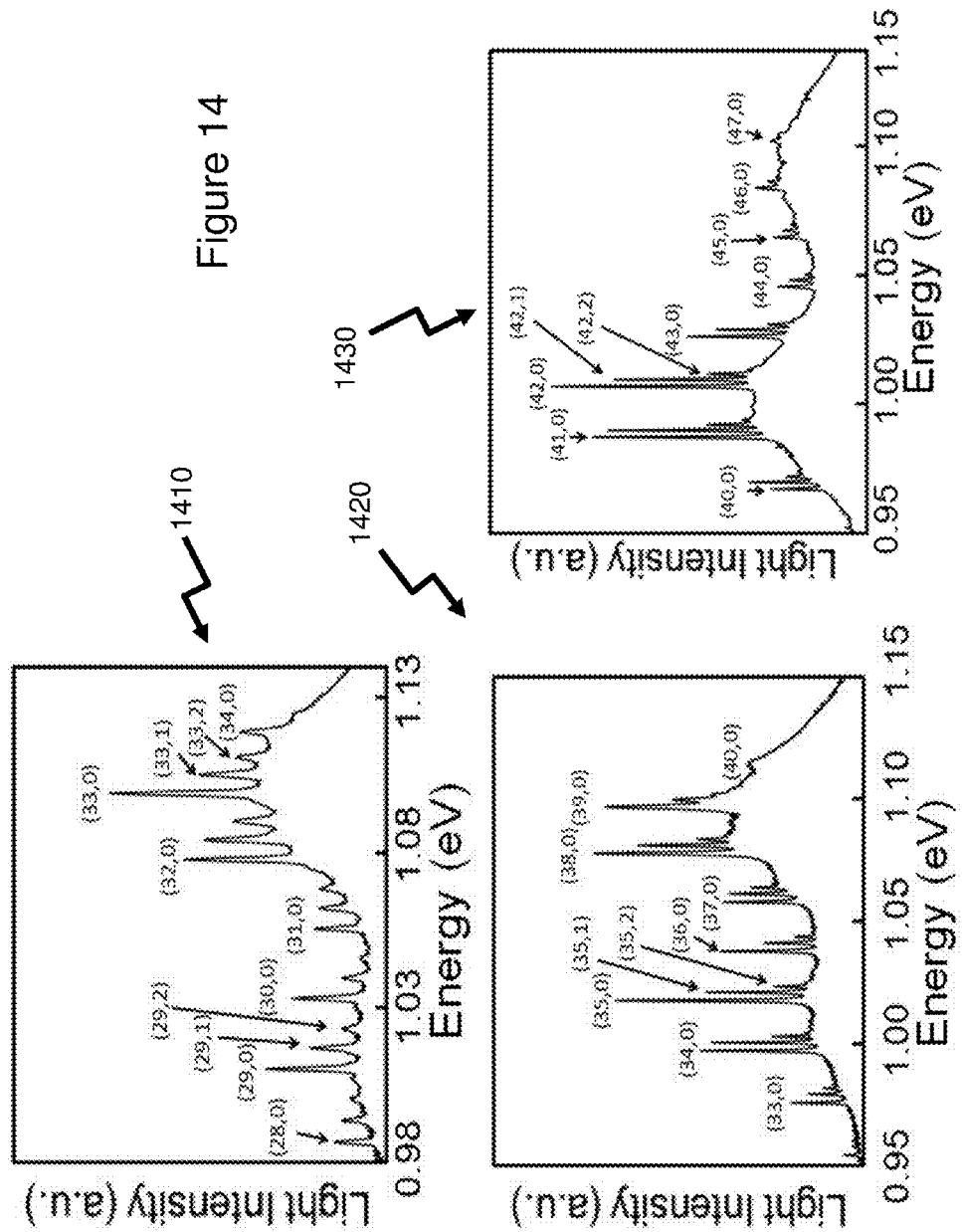
FIG. 14 depicts optical emission spectra for semiconductor tubes according to embodiments of the invention.

Referring to FIG. 13 there are depicted first to third optical emission spectra 1310 to 1330 respectively for semiconductor tubes according to embodiments of the invention. The emission characteristics of an InGaAs/GaAs bilayer heterostructure with quantum dots are shown using micro-photoluminescence spectroscopy at 293 K. Shown in first optical emission spectrum 1310 the emission spectrum of semiconductor tube resonators with a wall thickness of approximately 250 nm under a pump power of approximately 30 μW is shown wherein six sharp optical resonant modes, equally separated by approximately 16 meV, can be clearly identified. By reducing the tube wall thickness to approximately 100 nm, the observed spectral eigenmodes related to light localization along the tube axis were observed with an intrinsic linewidth of approximately 0.6 nm, corresponding to a Q-factor of ~2,000. This being depicted in second optical emission spectrum 1320.

Similarly emission characteristics of InGaAs/GaAs QD semiconductor tubes at 77 K are shown in third optical emission spectrum 1330 for a pump power of 32 μW. Six groups of sharp optical resonant modes, corresponding to orders 39 to 44 are evident, with the dominant modes of each group spaced apart by approximately 20.5 meV. Emission from the as-grown QD layers is also shown for comparison. Additionally, associated with each azimuthal mode is a group of at least five spectral eigenmodes, separated by approximately 3-4 meV, which are directly related to light localization along the tube axis due to the presence of surface corrugations Now referring to FIG. 14 there are depicted first to third optical emission spectra 1410 to 1430 respectively demonstrating the variations of spectra with wall thickness. Again free-standing InGaAs/GaAs quantum dot semiconductor tube ring resonators were measured using micro-photoluminescence spectroscopy at room temperature wherein the devices were excited with a He—Ne laser beam ($\lambda$, =632.8 nm) through a 60× objective lens. Light emitted from the semiconductor tube was collected by the same objective, analyzed by a high-resolution spectrometer with lock-in amplification, and detected using a liquid nitrogen cooled InGaAs detector. In these spectra the semiconductor tube devices exhibit diameters of approximately 5-6 μm and have wall thicknesses varying from approximately 50 nm to 200 nm and exhibit an engineered surface geometry, which can be approximated as a parabolic shape. The measured emission spectra of semiconductor tubes with wall thicknesses of approximately 50 nm, 100 nm, and 200 nm are shown in first to third optical emission spectra 1410 to 1430 respectively. It is evident that the emission spectra are characterized by several groups of sharp optical resonance modes, which are denoted by associated azimuthal and axial mode numbers (m, p), due to photon confinement around the circumference and axial directions of the tube, respectively. The energy separations between the adjacent azimuthal modes are approximately 24, 21 and 19 meV, and the energy separations between the adjacent axial modes are approximately 7, 4 and 2-3 meV, for semiconductor tubes with wall thicknesses of approximately 50 nm, 100 nm, and 200 nm, respectively.

The dependence of emission characteristics of semiconductor tube ring resonators on the surface geometry can be explained by an equivalent planar waveguide model with periodic boundary conditions. In this model, the unique surface geometry of the semiconductor tube can be modeled by a tapered region in the dielectric waveguide. Details about this model are described above. In this analysis, the axial optical field distribution $\phi(z)$ can be derived from the Equation (3) below.

where z represents the tube axial direction, k is the vacuum wave vector, and $\beta$ is the propagation constant along the tube circumference. neff(z) is the effective refractive index averaged over the circumference of the tube, which is directly related to the tube surface geometry.

For a given wave vector k, discrete eigenvalues of $\beta$, i.e., $\beta p(k)$ (p=0, 1, 2, 3 ... ), can be obtained by solving Equation (3) analytically or numerically. In addition, the optical resonance modes satisfy the azimuthal phase matching condition, described by, $\beta L=2\pi m$ where L is the circumference of the semiconductor tube and m is azimuthal mode number 0.16, 20, 22, etc for example. The eigenenergy of each optical resonance mode can then be derived from the above equations. The optical mode numbers (m, p), shown in first to third optical emission spectra 1410 to 1430 were obtained from this model. Detailed studies further confirm that these calculations agree well with the experimental results.

Figure 15:
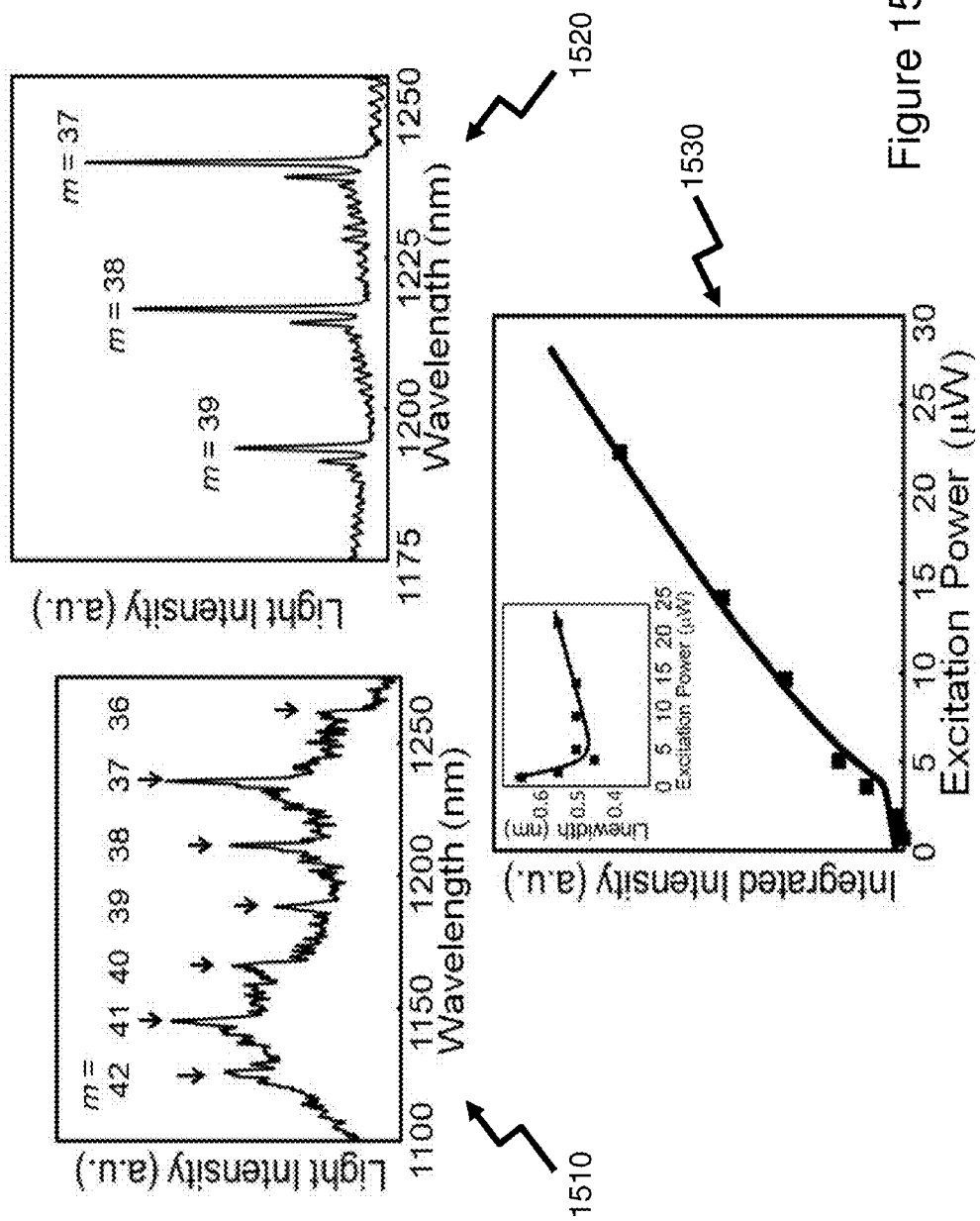
FIG. 15 depicts optical emission spectra for semiconductor tubes according to embodiments of the invention and emission versus current of an electrically injected optical semiconductor tube emitter.

Now referring to FIG. 15 there are depicted first and second optical emission spectra 1510 and 1520 for semiconductor tubes according to embodiments of the invention and the I-V curve 1530 for an electrically injected optical semiconductor tube emitter. First and second optical emission spectra 1510 and 1520 representing room temperature lasing in rolled-up InGaAs/GaAs quantum dot semiconductor tube ring cavities, with a diameter of approximately 5 μm and wall thickness of approximately 125 nm, representing 2.5 revolutions. First and second optical emission spectra 1510 and 1520 being measured below (approximately 3 μW) and above the threshold (approximately 25 μW) respectively. The dominant lasing wavelengths are 1193.6 nm, 1216.5 nm and 1240.7 nm, with the corresponding azimuthal mode numbers of 39, 38 and 37 respectively. Referring to I-V curve 1530 the integrated intensity of the emission peak at 1240.7 nm as a function of the absorbed pump power by the semiconductor tube is plotted. An ultralow threshold of approximately 4 μW is estimated. Variation of spectral linewidth versus optical pump power is shown in the inset of third optical emission spectrum 1530. With the increase of pump power, a linewidth reduction from approximately 0.6-0.8 nm to approximately 0.4-0.5 nm is observed, which agrees well with the measured threshold, further confirming lasing from the semiconductor tube cavity. A small increase of the spectral linewidth at higher pump power is also evident, possibly due to heating effect. Other lasing modes exhibit similar characteristics.

Figure 16:
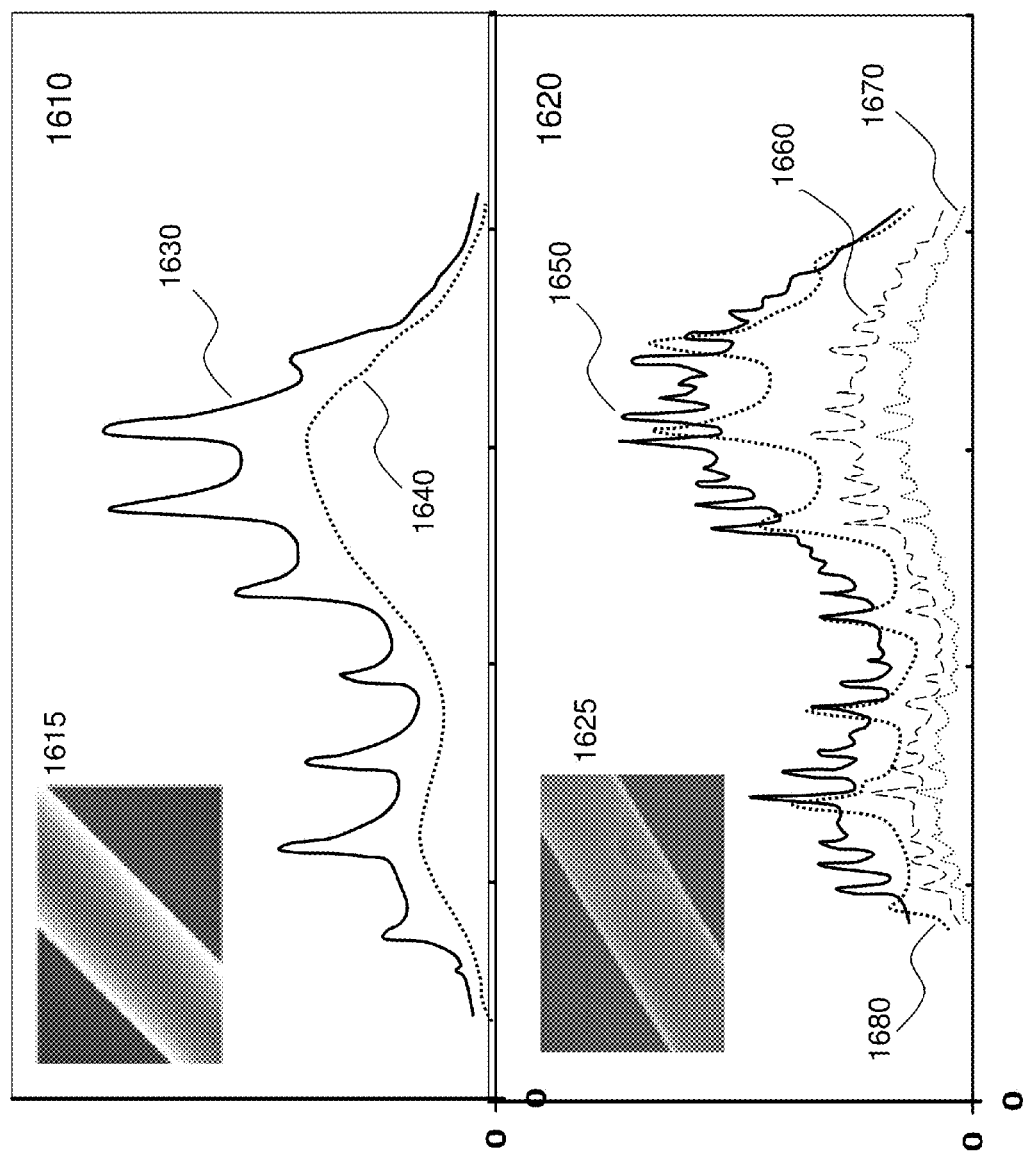
FIG. 16 depicts the variation in optical emission for semiconductor tubes according to embodiments of the invention showing the impact of the profile of the end of the semiconductor "sheet" that is rolled up.

FIG. 16 depicts the variation in optical emission for semiconductor tubes according to embodiments of the invention showing the impact of the profile of the end of the semiconductor "sheet" that is rolled up. As above a bilayer heterostructure InGaAs/GaAs QD semiconductor tube ring resonator was investigated using micro-photoluminescence spectroscopy at 300 K with He—Ne laser excitation (632.8 nm) to optically excite the device through a 60 (0.8 NA) objective lens. The spectrally resolved emission is detected by an InGaAs detector with lock-in amplification.

In regions of the semiconductor tube that are attached to the substrate, a broad emission spectrum is generally observed, shown as the dotted line 1640 in first spectrum 1610. The absence of any optical resonance modes is largely due to radiative loss through the substrate. A typical emission spectrum measured from the free-standing region of such a semiconductor tube is shown as the solid line 1630 in first spectrum 1610. This spectrum being characterised by a sequence of regularly spaced optical resonance modes superimposed on a broad InGaAs/GaAs QD emission spectrum. The pump power was 27 mW.

These resonance modes, arising from photons confined around the periphery of the semiconductor tube by total internal reflection, are separated by approximately 19.5 meV. The corresponding azimuthal numbers (m=38 to 45) were derived from modeling the semiconductor tube as being of diameter approximately 6 μm and 2.4 revolutions. The relatively small Q-factor (approximately 350) is attributed to the poor optical confinement provided by the random surface roughness along the tube axial direction. First insert 1615 shows an SEM of the semiconductor tube.

A significantly different emission spectra, however, is observed in freestanding semiconductor tubes with an engineered surface geometry, see second insert 1625 in second spectra 1620. First to third emission spectra 1650 to 1670 being measured at pump powers of 27 μW, 12 μW, and 81 μW respectively at 300 K. The optical resonance mode distribution for the semiconductor tube employed in first spectrum 1620 is also shown (dotted curve 1680) for comparison. Careful examination reveals that there are eight groups of eigenmodes, with the lowest energy mode in each group approximately aligned to the modes non-structured design. Additionally, each group of resonance modes consists of four sharp peaks, separated by approximately 3-5 meV, which are directly related to the strong photon confinement along the tube axial direction by the intentionally introduced corrugations on the tube surface, evident in second insert 1625. The resulting axial field dispersion also implies that the wave vector of each confined photon is not only determined by the azimuthal mode number (m) but also directly related to an additional axial mode number (p), thereby leading to different eigen energies. The minimum intrinsic linewidth of 0.5 meV at room temperature was established, which corresponds to a maximum Q-factor of approximately 2000. Further improvement in the Q-factor may be achieved by optimising the optical confinement along the tube axial direction.

Figure 17:
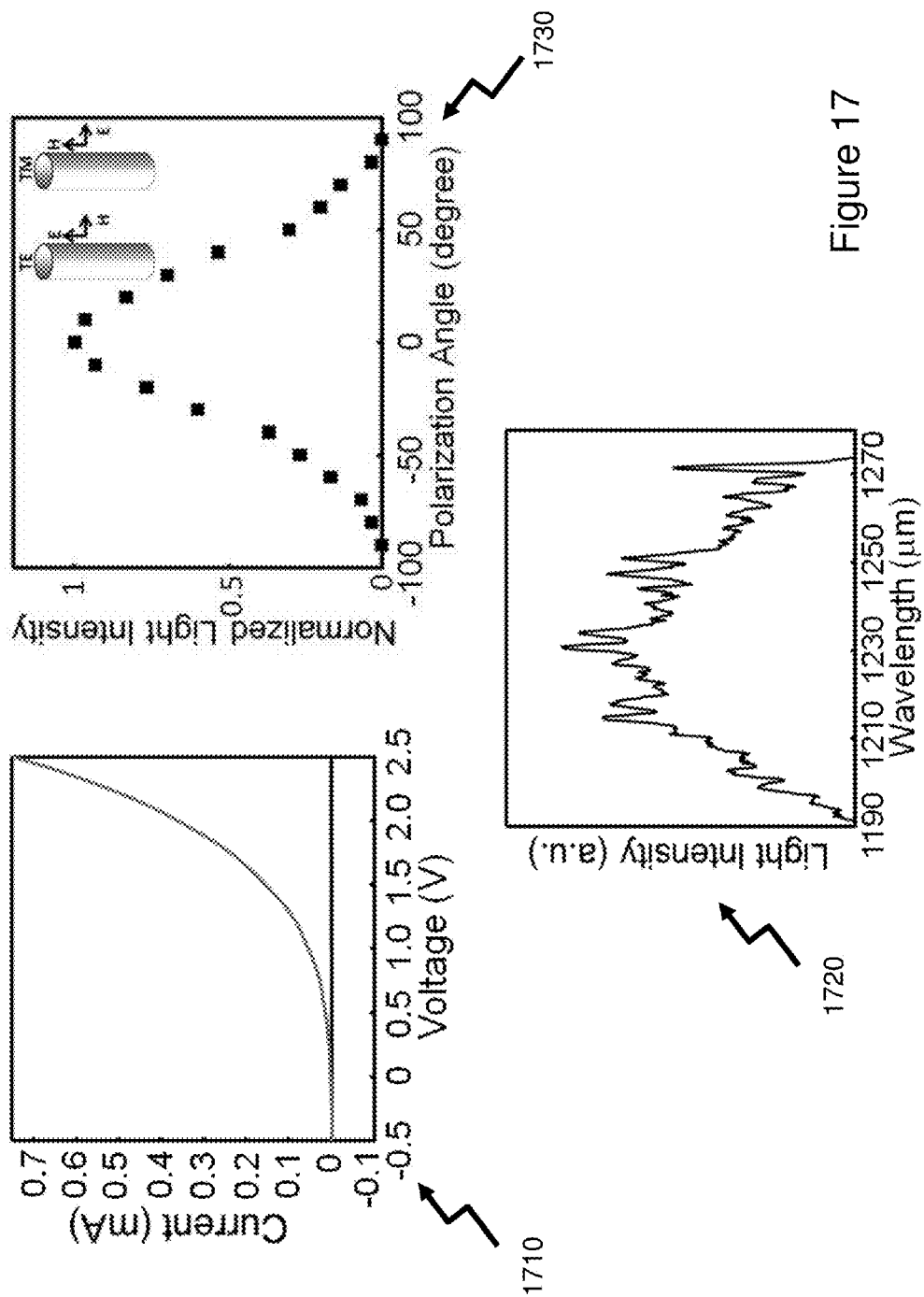
FIG. 17 depicts an I-V plot for electrically injected optical semiconductor tube emitter and the polarization behaviour of an optically pumped semiconductor tube according to embodiments of the invention.

Referring to FIG. 17 there is depicted an I-V plot 1710 for an electrically injected optical semiconductor tube emitter and the polarization behaviour of an optically pumped semiconductor tube according to embodiments of the invention. With the p-contact placed directly near the device active region, the device resistance and heating effect can be drastically reduced. In spite of the presence of metal contacts on the tube surface, optical resonance modes were clearly observed under optical pumping in first spectrum 1720. The polarization properties of the coherent emission from semiconductor are plotted in polarization plot 1730. For photons circulating around the periphery of the tube, electric fields of the TE and TM modes are defined as parallel and normal to the tube surface, respectively. The polarization measurements were performed by inserting a linear polarizer in the optical beam path. The semiconductor tube and polarizer were carefully aligned such that 0° and 90° correspond to TE and TM polarizations, respectively. The peak intensity was then recorded by varying the polarization angle. Plotted in polarization plot 1730 is the intensity of the lasing mode at 1240.7 nm as a function of the polarization angle. It is seen that the laser emission is primarily TE polarized. This observation is also consistent with recent theoretical and experimental studies that only TE optical modes, with an electric field parallel to the tube surface, can be supported by a rolled-up semiconductor tube ring resonator with a relatively thin wall (approximately 40 nm to 200 nm).

Figures 18, 19:
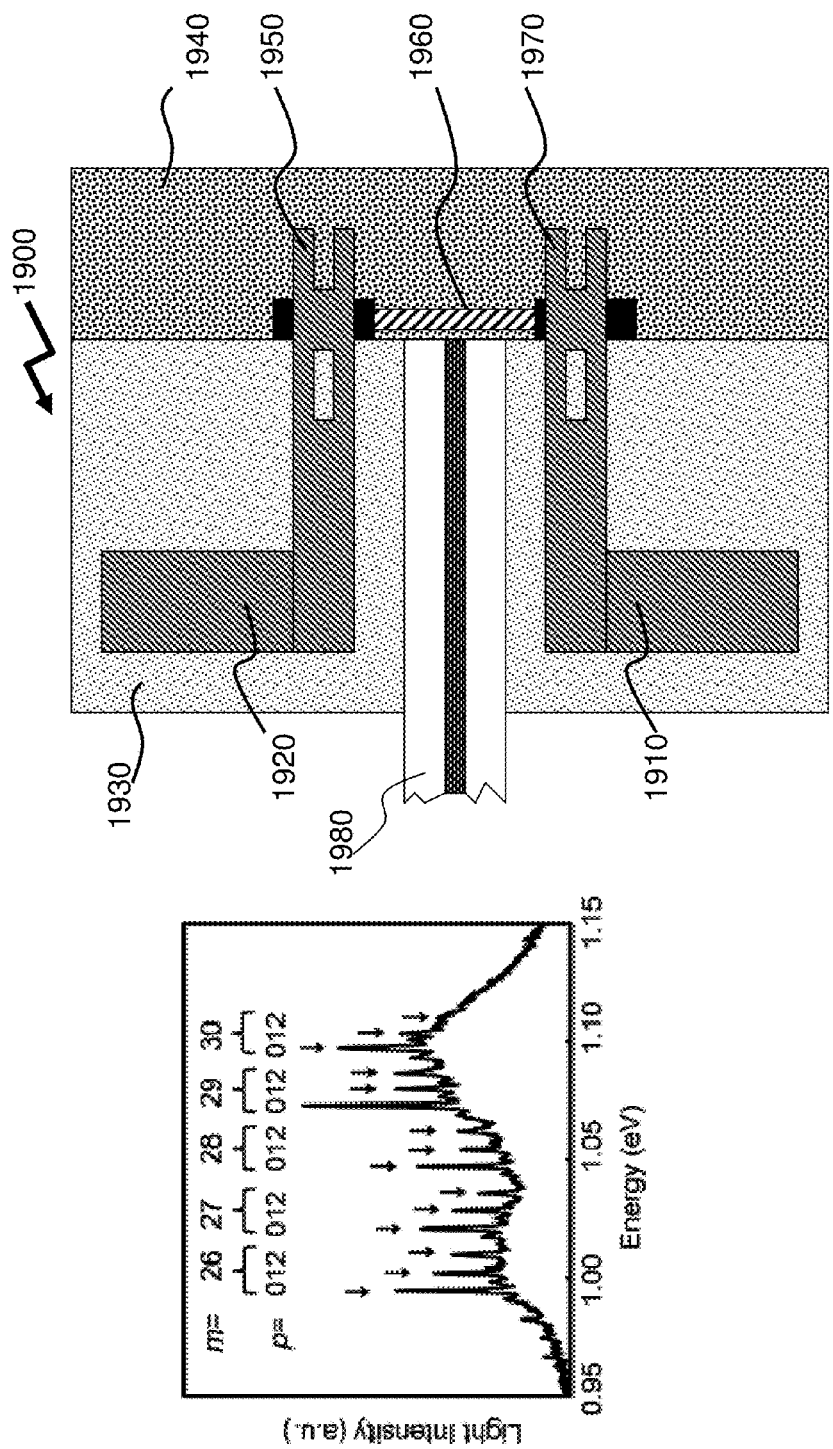
FIG. 18 depicts the emission spectrum for a semiconductor tube transferred to a silica substrate by a "pick-and-place" technique for semiconductor tubes with precision and low stress.
FIG. 19 depicts a schematic for an optical photodetector according to an embodiment of the invention.

Referring to FIG. 18 there is depicted the emission spectrum for a semiconductor tube transferred to a silica substrate. As with previous analysis the emission characteristics of semiconductor tube devices transferred on a fiber facet were studied by micro-photoluminescence spectroscopy at room temperature with optical pumping using a He—Ne laser at 632.8 nm with an absorbed pump power of 20 µW was obtained. The associated azimuthal mode number (m) and eigenmodes (p) for each resonance mode are identified against these optical resonances in the graph. The semiconductor tube was positioned according to the technique reported by Zhaobing Tian et al in "Controlled Transfer of Single Rolled-Up InGaAs—GaAs Quantum Dot Microtube Ring Resonator using Optical Fiber Abrupt Tapers" (IEEE Photonics Tech. Lett., Vol. 22 (5), pp 311-313) that as a low stress method demonstrates that the semiconductor tubes are manufactured with low internal stress. The method exploits optical fiber abrupt tapers, made by a fusion splicer machine, which are inserted into each end of the semiconductor tube as the tube diameter $\phi$ is larger than the size of the taper tip. The very small contact area between the free-standing semiconductor tube devices and their initial GaAs substrate means that the surface tension is much smaller, compared to conventional planar devices. Consequently, detaching the semiconductor tube devices from the host substrate can be achieved without introducing any structural defects and/or mechanical distortion and controllably transferred using either one or two fiber tapers and precisely positioned on a foreign substrate.

The energy separations for the dominant modes between two adjacent groups and for the two adjacent modes within the same group are approximately 26 and 7.5 meV, respectively, which agree well with our calculations. The measured spectral linewidths are approximately 1 nm, corresponding to a Q factor of approximately 1100. The intrinsic-factor may be significantly higher, due to the presence of two non-degenerate modes induced by the inside and outside edges around the tube and can be further improved by optimizing the design and fabrication process. The emission characteristics of quantum-dot semiconductor tubes transferred on the cleaved facet of a fiber are nearly identical, in terms of both the mode profiles and light intensity, to those of similar quantum-dot semiconductor tube devices fabricated directly on GaAs substrates, which further confirms the present fiber taper assisted transfer technique is suitable for achieving high-quality micro- and nanotube-based optical cavities on a foreign substrate.

Finally, it is important to note that emission from the rolled-up tube cavity devices can also be directly coupled to the optical fiber, with the coupling efficiency precisely determined by the vertical separation, or the number of revolutions of the semiconductor tube sidepieces. With the development of the fiber taper assisted transfer technique, it is also expected that nearly defect-free III-V micro- and nanotube-based nanophotonic devices can be readily achieved on any foreign substrate. More importantly, it provides a viable approach for the monolithic integration of high-performance III-V semiconductor micro- and nanoscale lasers with Si waveguides and other nanophotonic devices on CMOS chips for example.

Referring to FIG. 19 there is depicted a detector assembly 1900 for an optical photodetector according to an embodiment of the invention. As such there shown a semiconductor tube fabricated according to an embodiment of the invention described above either in-situ or transferred using the fiber taper transfer process. Considering the scenario that the semiconductor tube 1960 being disposed upon unetched region 1940, the etched region 1930 being to the left and upon which are deposited first and second electrodes 1920 and 1910 that connect to photodetector leads 1950 and 1970 respectively. These photodetector leads 1950 and 1970 respectively are each connected to one rolled end of the semiconductor tube 1960, such as described supra in respect of FIGS. 5A and 5B. Accordingly a potential difference exists between photodetector leads 1950 and 1970 such that the semiconductor tube 1960 is reverse biased. An optical fiber, for example Corning SMF-28 which is a singlemode optical fiber 1980 with an approximately 8 µm core, is positioned laterally with respect to the semiconductor tube 1960. The singlemode optical fiber 1980 being positioned within a groove, i.e. V-groove on silicon or U-groove on GaAs so that the core is vertically aligned with the semiconductor tube 1960. Accordingly optical signals emitted from the singlemode optical fiber 1980 are coupled to the photodetector, formed by reverse biased semiconductor tube 1960, and the generated photocurrent coupled to electronic circuitry within the integrated circuit of which detector assembly 1900 forms part.

It would be evident that microwave/RF optical systems may exploit GaAs electronics as well as 10 Gb/s, 20 Gb/s, and 40 Gb/s telecommunications systems whilst data communications and lower speed telecommunication up to about 10 Gb/s may exploit silicon electronics. For example the photodetector may form directly part of a circuit with an FET amplifier. It would also be evident to one skilled in the art that the semiconductor tube 1960 may through the use of multiple quantum well structures and quantum dots be implemented as an avalanche photodiode. Additionally whilst the biasing of the photodetector has been described as being along the longitudinal axis of the photodetector it would be apparent that a metallization on the upper surface of the film prior to rolling up may be provided such that a the potential may be provided axially through the thickness of the semiconductor tube wall, particularly when the quantum structures are sandwiched between the inner and outer walls.

Figure 20:
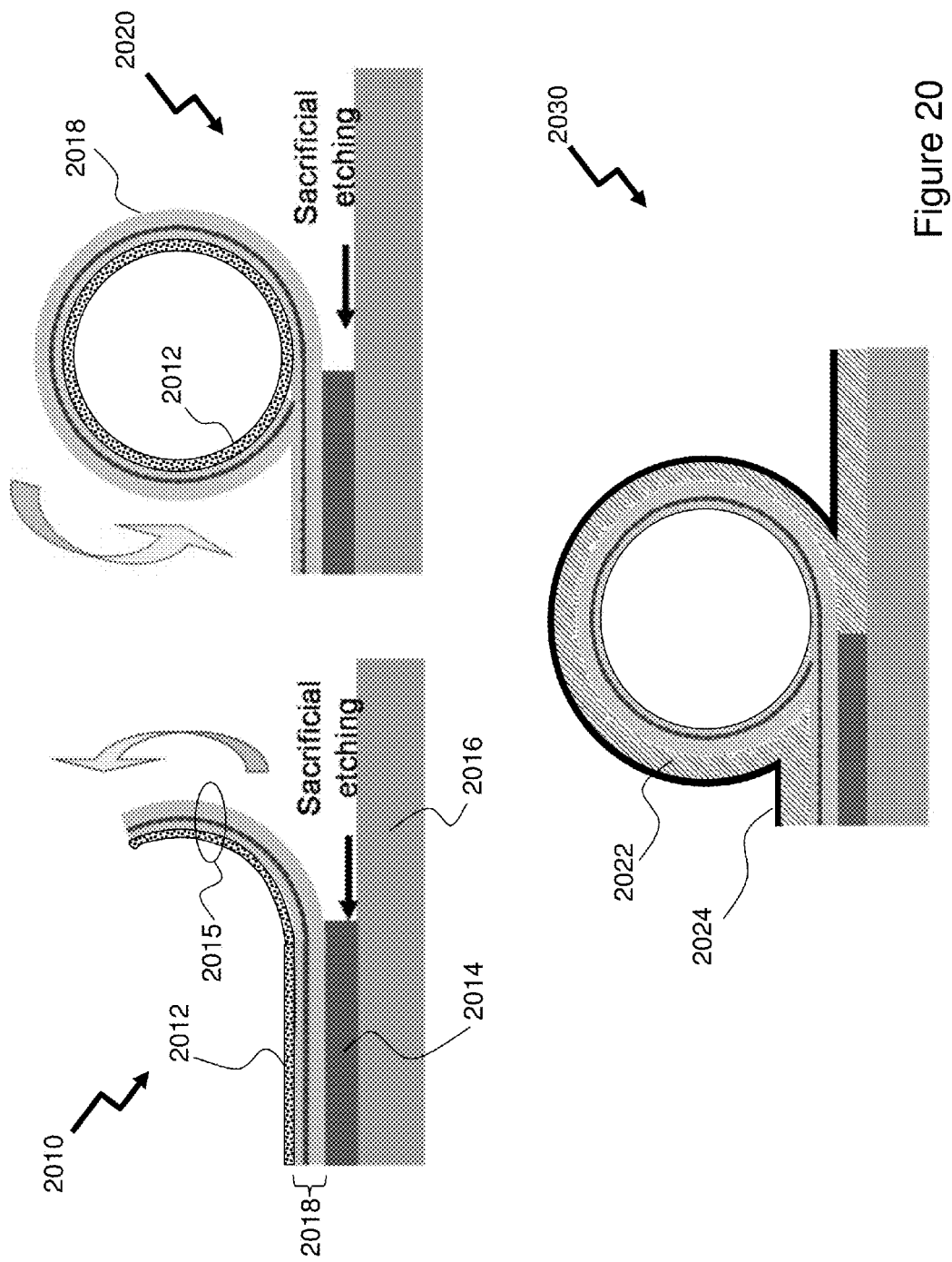
FIG. 20 depicts schematics of manufacturing semiconductor tubes with metalized inner surfaces and for fabricating a capacitor according to an embodiment of the invention.

Now referring to FIG. 20 depicts schematics of manufacturing semiconductor tubes with metalized inner surfaces and for fabricating a capacitor according to an embodiment of the invention. Referring to first schematic 2010 there is shown a rolling process part-way through processing. Accordingly there are shown a substrate 2016 upon which have been deposited sacrificial layer 2014, tube layers 2018 and an upper layer 2012. Accordingly as the sacrificial layer 2014 is etched away the film 2015 comprising tube layers 2018 and upper layer 2012 curls due to the stress distribution within the layers. As etching proceeds as shown in second schematic 2020 the process has continued and now the rolled-up tube has an inner wall that is now completely "coated" with the upper layer 2012. Upper layer 2012 may for example be a metal, such as tungsten or copper, an oxide, a polymer, or an organic receptor.

Where the upper layer 2012 is a metal the resultant semiconductor tubes may provided novel catalytic environments for chemical reactions or the cracking of water through electrolysis with tungsten/copper surfaces for trapping the generated hydrogen and oxygen. Where an oxide is employed one option is titanium oxide for the photolytic cracking of water wherein the walls of the semiconductor tubes are either transparent to the required wavelength of the solar spectrum or due to their low thickness provide relatively low absorption. Alternatively tungsten oxide may, through its material properties varying with the present of nitrous oxide, hydrogen sulphide, ethanol, carbon monoxide, ammonia and ozone, provide for a change in the optical properties of the semiconductor tubes that may form the basis for sensing devices. Likewise polymer and organic receptor materials may provide a means of implementing sensors as the very high Q optical cavities would be easily impacted by small changes in the overall optical cavity that would vary when the refractive index shifted from bonding of antigens to an organic receptor for example.

Also shown in FIG. 20 is a cross-section of a semiconductor tube capacitor implemented according to an embodiment of the invention. Accordingly once the semiconductor tube has been rolled up an oxide 2022 and metallization 2024 are patterned onto the semiconductor tube. Accordingly through appropriate design of the metallization 2024 and oxide 2022 a thin film variable capacitor may be implemented without the requirements for high resolution photolithography with very high surface geometry as for example is evident in the work of W. M. Farnworth et al in U.S. Pat. No. 7,081,385 entitled "Nanotube Semiconductor Devices and Methods of Making the Same" wherein the nanotubes were formed vertically upon the substrate. In contrast the nanotubes provided according to embodiments of the invention may be a few microns, tens of microns, or hundreds of microns long and yet all be of consistent diameter such that planar processing in the subsequent stages is the same for all devices irrespective of the tube length, unlike Farnworth. Also through the unique properties of the semiconductor tubes it may serve as a dielectric material and hence form a capacitor, and it may equally serve as a semiconductor material and form a transistor channel within the same device. Further, the consistency of such nanotubes formed by a simple planar deposition/lithography process prior to their rolling-up will result in improved reproducibility of the characteristics of the devices both device-device, die-to-die, and wafer-to-wafer.

Referring to FIG. 21 there is depicted a schematic for manufacturing semiconductor tubes with high density according to an embodiment of the invention. Accordingly in first schematic 2110 an epitaxial structure 2130 has been formed on the substrate 2115 and comprises first to third sacrificial layers 2112A through 2112C respectively and first to third bilayer heterostructure QD layers 2114A through 2114C respectively that are alternating within the epitaxial structure 2130. Processing of the epitaxial structure 2130 provides within each of the first to third bilayer heterostructure QD layers 2114A through 2114C respectively the mesa and patterned edges for the film prior to rolling up. Now, as shown etching of the sacrificial layer proceeds to etch each of the first to third sacrificial layers 2112A through 2112C respectively such that the first to third bilayer heterostructure QD layers 2114A through 2114C respectively begin to curl.

Now looking at second schematic 2120 this process has proceeded to the point that each first to third bilayer heterostructure QD layers 2114A through 2114C respectively has curled completely once to form first to third semiconductor tubes 2125A through 2125C are formed. It would be evident to one skilled in the art that using an epitaxial structure such as epitaxial structure 2130 allows the density of the semiconductor tubes to be increased within the finished device. It would also be evident that each of the first to third bilayer heterostructure QD layers 2114A through 2114C respectively may be the same or implemented with a different epitaxial structure so that adjacent tubes exhibit different optical properties. For example three adjacent tubes may be provided that emit in the red, green, and blue wavelength regions to form a pixel within a display, or as with Sharp Quattron four emitter colors including an additional yellow. Accordingly as all "red" emitters are formed from the same layer in the epitaxial stack they will have improved uniformity.

It would be evident that the above referenced process may also be applied to other materials such as lead zirconium titanate (PZT), lanthanum doped lead zirconium titanate (PLZT) and other ceramics in thin film form to exploit their piezoelectric and ferroelectric properties to yield electrically tunable structures, such as adjusting the diameter of the resonator for example.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A device comprising:
    a substrate; and
    a semiconductor nanotube comprising at least:
        a first predetermined portion formed from a first predetermined number of revolutions of a semiconductor film within a spiral comprising a plurality of semiconductor layers, wherein the plurality of semiconductor layers have a first predetermined profile of at least one of stress and strain from a first surface of the semiconductor film to a second opposite surface of the semiconductor film; and
        second and third predetermined portions at each end of the first predetermined portion, the second and third predetermined portions formed from a second predetermined number of revolutions of the semiconductor film within the spiral comprising the plurality of semiconductor layers such that the first predetermined portion of the semiconductor nanotube has a smaller diameter than the second predetermined portion.

2. The device according to claim 1, wherein
    the first predetermined profile of at least one of stress and strain from the first surface of the semiconductor film to the second opposite surface of the semiconductor film is related to at least one of another stress and another strain established within a second plurality of semiconductor layers deposited onto the substrate during the manufacturing sequence of the device wherein the second plurality of semiconductor layers comprises the plurality of semiconductor layers and a sacrificial etch layer, wherein the sacrificial etch layer is between the substrate and the plurality of semiconductor layers.

3. The device according to claim 2, wherein
    the second plurality of semiconductor layers further comprises a buffer layer disposed between the substrate and the sacrificial etch layer.

4. The device according to claim 1, wherein
    a predetermined portion of the outer edge of the semiconductor film within the first predetermined portion of the semiconductor nanotube has a predetermined profile, the predetermined profile other than a line aligned to the axis of the semiconductor nanotube.

5. The device according to claim 1, wherein
    the second and third predetermined portions of the semiconductor nanotube are continuous with another region of the semiconductor film which is still attached to the substrate by an intervening sacrificial etch layer.

6. The device according to claim 1, wherein
the second and third predetermined portions of the semiconductor nanotube are continuous with first and second regions of the semiconductor film which is still attached to the substrate by an intervening sacrificial etch layer.

7. The device according to claim 1, wherein
the second predetermined portion of the semiconductor nanotube is continuous with a first region of the semiconductor film which is still attached to the substrate by an intervening sacrificial etch layer;
the third predetermined portion of the semiconductor nanotube is continuous with a second region of the semiconductor film which is still attached to the substrate by an intervening sacrificial etch layer; wherein
the first region of the semiconductor film has a first electrical contact disposed upon it; and
the second region of the semiconductor film has a second electrical contact disposed upon it.

8. The device according to claim 1, further comprising;
a first electrode formed upon a region of the semiconductor film comprising the plurality of semiconductor layers which is still attached to the substrate by an intervening sacrificial etch layer, wherein the second and third predetermined portions of the semiconductor nanotube are continuous with the region of the semiconductor film.

9. The device according to claim 1, further comprising
a first electrode formed upon a region of the semiconductor film comprising the plurality of semiconductor layers which is still attached to the substrate by an intervening sacrificial etch layer, wherein the second and third predetermined portions of the semiconductor nanotube and the region of the semiconductor film are continuous; and
a second electrode comprising at least a first portion formed upon a layer deposited onto the substrate after the semiconductor nanotube has been formed and a second portion in contact with the outer surface of the first predetermined portion of the semiconductor nanotube.

10. The device according to claim 9, wherein
the first electrode provides a n-metal contact to the semiconductor nanotube and the second electrode provides a p-metal contact to the semiconductor nanotube.

11. The device according to claim 1, wherein
the plurality of semiconductor layers comprise at least one layer comprising at least one of quantum dots and a quantum well.

12. The device according to claim 1, wherein
the plurality of semiconductor layers are selected in dependence upon a predetermined optical wavelength for an optical emitter of which the semiconductor nanotube comprises part.

13. The device according to claim 1, wherein
the second and third predetermined portions of the semiconductor nanotube are disposed upon at least one of a first electrical contact structure formed upon the substrate and first and second electrical contact structure formed upon the substrate.

14. The device according to claim 1, wherein
the substrate comprises a trench, the trench being disposed relative to the semiconductor nanotube such that the first predetermined portion of the semiconductor nanotube is disposed over the trench.

15. The device according to claim 1, wherein
the semiconductor nanotube is an optical emitter; and
the outer edge of the semiconductor film within the first predetermined portion of the semiconductor nanotube has a predetermined profile that provides a predetermined surface corrugation to the semiconductor nanotube, wherein the predetermined surface corrugation controls the lasing modes of the semiconductor nanotube.

* * * * *